United States Patent
Ling et al.

(10) Patent No.: US 11,961,662 B2
(45) Date of Patent: Apr. 16, 2024

(54) HIGH TEMPERATURE SUPERCONDUCTING CURRENT LEAD ASSEMBLY FOR CRYOGENIC APPARATUS

(71) Applicant: GE PRECISION HEALTHCARE LLC, Wauwatosa, WI (US)

(72) Inventors: Jiayin Ling, New Berlin, WI (US); Longzhi Jiang, Florence, SC (US); Liyang Ye, Florence, SC (US); Stuart Paul Feltham, Florence, SC (US); Thomas Edward Moran, Menomonee Falls, WI (US); Ernst Wolfgang Stautner, Niskayuna, NY (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 540 days.

(21) Appl. No.: 16/923,321

(22) Filed: Jul. 8, 2020

(65) Prior Publication Data

US 2022/0013266 A1    Jan. 13, 2022

(51) Int. Cl.
*H01F 6/06*    (2006.01)
*B33Y 50/02*    (2015.01)
(Continued)

(52) U.S. Cl.
CPC ............... *H01F 6/06* (2013.01); *B33Y 50/02* (2014.12); *B33Y 80/00* (2014.12); *H01F 6/04* (2013.01);
(Continued)

(58) Field of Classification Search
CPC .............. H01F 6/06; F28F 1/40; B33Y 80/00
See application file for complete search history.

(56) References Cited

U.S. PATENT DOCUMENTS

| 3,715,452 A | 2/1973 | Long |
| 4,394,634 A | 7/1983 | Vansant |

(Continued)

FOREIGN PATENT DOCUMENTS

| CN | 102867610 B | 9/2014 |
| CN | 107068324 B | 5/2018 |

(Continued)

OTHER PUBLICATIONS

Ryan O'Hara, Taking Heat Exchanger Design to the Next Level with High-Performance Geometry, nTopology, Published Dec. 16, 2019, available at https://ntopology.com/blog/heat-exchanger-design-high-performance/ (Year: 2019).*

(Continued)

*Primary Examiner* — Kyle A Cook
(74) *Attorney, Agent, or Firm* — Armstrong Teasdale LLP

(57) ABSTRACT

A method of manufacturing a lead assembly of a cryogenic system is provided. The method includes developing a three-dimensional (3D) model of a heat exchanger. The heat exchanger includes a plurality of channels extending longitudinally through the heat exchanger from the first end to the second end, the plurality of channels forming a plurality of thermal surfaces within the heat exchanger, the heat exchanger having a transverse cross section. The method further includes modifying the 3D model by at least one of reducing an area of the cross section and increasing the plurality of thermal surfaces. The method also includes additively manufacturing the heat exchanger using an electrically-conductive and thermally-conductive material according to the modified 3D model. Further, the method includes providing a high temperature superconductor (HTS) assembly that includes an HTS strip, and connecting the HTS assembly to the heat exchanger at the second end of the heat exchanger.

10 Claims, 22 Drawing Sheets

(51) Int. Cl.
  *B33Y 80/00* (2015.01)
  *H01F 6/04* (2006.01)
  *B33Y 10/00* (2015.01)
  *G01R 33/34* (2006.01)

(52) U.S. Cl.
  CPC ......... *B33Y 10/00* (2014.12); *G01R 33/34023* (2013.01)

(56) References Cited

U.S. PATENT DOCUMENTS

| | | | |
|---|---|---|---|
| 4,453,149 A | 6/1984 | Rios | |
| 4,518,885 A * | 5/1985 | Eckels | H02K 55/04 62/505 |
| 4,600,802 A | 7/1986 | Ihas et al. | |
| 4,625,193 A | 11/1986 | Purcell | |
| 4,754,249 A | 6/1988 | Yamamoto et al. | |
| 4,895,831 A | 1/1990 | Laskaris | |
| 5,166,776 A | 11/1992 | Dederer et al. | |
| 5,298,679 A * | 3/1994 | Wu | H01F 6/04 505/887 |
| 5,317,296 A | 5/1994 | Vermilyea et al. | |
| 5,396,206 A | 3/1995 | Herd et al. | |
| 5,426,094 A | 6/1995 | Hull et al. | |
| 5,432,297 A | 7/1995 | Dederer et al. | |
| 5,720,173 A | 2/1998 | Bonmann et al. | |
| 5,742,217 A | 4/1998 | Bent et al. | |
| 5,880,068 A | 3/1999 | Gamble et al. | |
| 5,991,647 A | 11/1999 | Brockenborough et al. | |
| 7,193,336 B1 | 3/2007 | Mueller et al. | |
| 7,372,273 B2 | 5/2008 | Huang et al. | |
| 8,650,888 B2 | 2/2014 | Steinmeyer et al. | |
| 9,182,464 B2 | 11/2015 | Mine et al. | |
| 9,552,906 B1 | 1/2017 | Mine et al. | |
| 2013/0092413 A1 * | 4/2013 | Citver | H01F 6/065 174/126.1 |
| 2016/0041240 A1 | 2/2016 | Jonas et al. | |
| 2017/0025850 A1 * | 1/2017 | Rey | H02J 1/14 |
| 2017/0091900 A1 * | 3/2017 | Mariappasamy | G06T 3/0006 |
| 2017/0205146 A1 * | 7/2017 | Turney | F28D 7/0033 |
| 2019/0011187 A1 | 1/2019 | Bucknell | |
| 2020/0080796 A1 * | 3/2020 | Dasgupta | F28F 7/02 |
| 2020/0081083 A1 * | 3/2020 | Ok | G01R 33/3815 |
| 2020/0102827 A1 * | 4/2020 | Morris | G06F 30/23 |
| 2020/0142450 A1 * | 5/2020 | Dan | G06F 1/182 |
| 2021/0003351 A1 * | 1/2021 | O | F28D 9/0062 |

FOREIGN PATENT DOCUMENTS

| | | |
|---|---|---|
| CN | 106971807 B | 6/2018 |
| JP | 50118284 A | 9/1975 |
| JP | 54174349 U | 12/1979 |
| JP | 59113674 A | 6/1984 |
| JP | 07297025 A | 11/1995 |

OTHER PUBLICATIONS

Machine translation of CN107068324A (Year: 2018).*
CN102867610 English Abstract, Espacenet search Feb. 10, 2022.
CN106971807 English Abstract, Espacenet search Feb. 10, 2021.
CN107068324 English Abstract, Espacenet search Feb. 10, 2022.
GB application 2109477.6 filed Jun. 30, 2021—Combined Search and Examination Report dated Dec. 10, 2021; 8 pages.
JP patent application 2021-082001 filed May 13, 2021—Office Action dated Aug. 3, 2022; Machine Translation; 4 pages.
JPH07297025_English_Abstract_Espacenet_search-results_Nov. 1, 2022.
JPS50118284A_Machine_Translation_Description_Espacent_Nov. 3, 2022.
JPS54174349U_Machine_Translation_Description_Espacent_Nov. 3, 2022.
JPS59113674_English_Abstract_Espacenet_search-results_Nov. 1, 2022.

* cited by examiner

HIGH TEMPERATURE SUPERCONDUCTING CURRENT LEAD ASSEMBLY FOR CRYOGENIC APPARATUS

BACKGROUND

The field of the disclosure relates generally to systems of lead assemblies and methods of manufacturing lead assemblies, and more particularly, to systems and methods of manufacturing lead assemblies for a cryogenic apparatus of a cryogenic system.

A cryogenic system includes a cryogenic apparatus such as a superconducting magnet for a magnetic resonance imaging (MRI) system, superconducting transformers, generators, and electronics. The cryogenic apparatus is cooled by keeping it in contact with a cooling source such as liquefied helium in order for the cryogenic apparatus to be operated in a superconducting condition. For the cryogenic apparatus to reach a certain operating status, electric power is provided to the cryogenic apparatus. For example, for the superconducting magnet of an MRI system to be ramped up to a certain magnetic field strength (e.g., 1.5 Tesla (T)), electrical power is provided from a power supply at a room temperature to the superconducting magnet for the magnet to generate a magnetic field from the electric current. The electric current is supplied to the cryogenic apparatus through a lead assembly.

Further, a lead assembly is conventionally manufactured by methods such as casting, machining, or metal injection molding. In those manufacturing processes, if the design of the lead assembly needs to be modified or has been modified, a new mold needs to be provided, which can be time consuming and costly.

At least some known lead assemblies and known design processes of lead assemblies are prone to certain problems, and improvements in lead assemblies are desirable.

BRIEF DESCRIPTION

In one aspect, a method of manufacturing a lead assembly of a cryogenic system is provided. The method includes developing a three-dimensional (3D) model of a heat exchanger having a first end and a second end opposite the first end. The heat exchanger includes a plurality of channels extending longitudinally through the heat exchanger from the first end to the second end, the plurality of channels forming a plurality of thermal surfaces within the heat exchanger, the heat exchanger having a transverse cross section. The method further includes modifying the 3D model by at least one of reducing an area of the transverse cross section and increasing the plurality of thermal surfaces. The method also includes additively manufacturing the heat exchanger using an electrically-conductive and thermally-conductive material according to the modified 3D model. Further, the method includes providing a high temperature superconductor (HTS) assembly that includes an HTS strip, and connecting the HTS assembly to the heat exchanger at the second end of the heat exchanger.

In another aspect, a cryogenic system is provided. The cryogenic system includes a vessel containing a cryogenic apparatus and a lead assembly. The lead assembly is embedded with the vessel and configured to provide electric current to the cryogenic apparatus. The lead assembly includes a heat exchanger and an HTS assembly. The heat exchanger is composed of an electrically-conductive and thermally-conductive material and has a first end configured to electrically connect to a power supply and a second end opposite the first end. The heat exchanger further includes a plurality of channels extending through the heat exchanger between the first end and the second end, the plurality of channels forming a plurality of thermal surfaces within the heat exchanger. The heat exchanger has a transverse cross section. The HTS assembly is coupled between the cryogenic apparatus and the heat exchanger at the second end of the heat exchanger, the HTS assembly including an HTS strip. The cross section and the plurality of thermal surfaces of the heat exchanger are dynamically modified in an additive manufacturing process such that a temperature at the second end of the heat exchanger is at or below a critical superconducting temperature of the HTS strip during ramping of the cryogenic apparatus.

In yet another aspect, a lead assembly of a cryogenic system is provided. The cryogenic system includes a vessel containing a cryogenic apparatus. The lead assembly includes a heat exchanger and an HTS assembly. The heat exchanger is composed of an electrically-conductive and thermally-conductive material and has a first end configured to electrically connect to a power supply and a second end opposite the first end. The heat exchanger further includes a plurality of channels extending through the heat exchanger from the first end to the second end. The plurality of channels form a plurality of thermal surfaces within the heat exchanger. The heat exchanger has a transverse cross section. The HTS assembly is coupled to the heat exchanger at the second end of the heat exchanger and configured to couple to the cryogenic apparatus, the HTS assembly including an HTS strip. The lead assembly is configured to provide electric current to the cryogenic apparatus and further configured to be embedded within the vessel. The heat exchanger dimensions and structure are dynamically modified during an additive manufacturing process, such that in use, a temperature at the second end of the modified heat exchanger is at or below a critical superconducting temperature of the HTS strip during ramping of the cryogenic apparatus.

DRAWINGS

DETAILED DESCRIPTION

The disclosure includes systems of lead assemblies and methods of designing and manufacturing lead assemblies. The lead assemblies disclosed herein may be embedded in a cryogenic system. The boil-off rate of cryogen for cooling the cryogenic apparatus in the cryogenic system is relatively low due to the highly-efficient heat changer and thermally-nonconductive high temperature superconductor (HTS) assembly of the lead assembly. The current lead design is optimized for minimum cryogen boil-off. As used herein, a material is thermally nonconductive when the material conducts relatively little heat, compared to copper or other electrically-conductive materials. The lead assemblies disclosed herein is cryogenically robust, and can withstand transient thermals and stresses caused by thermal contraction. Method aspects will be in part apparent and in part explicitly discussed in the following description.

Figure 1A:
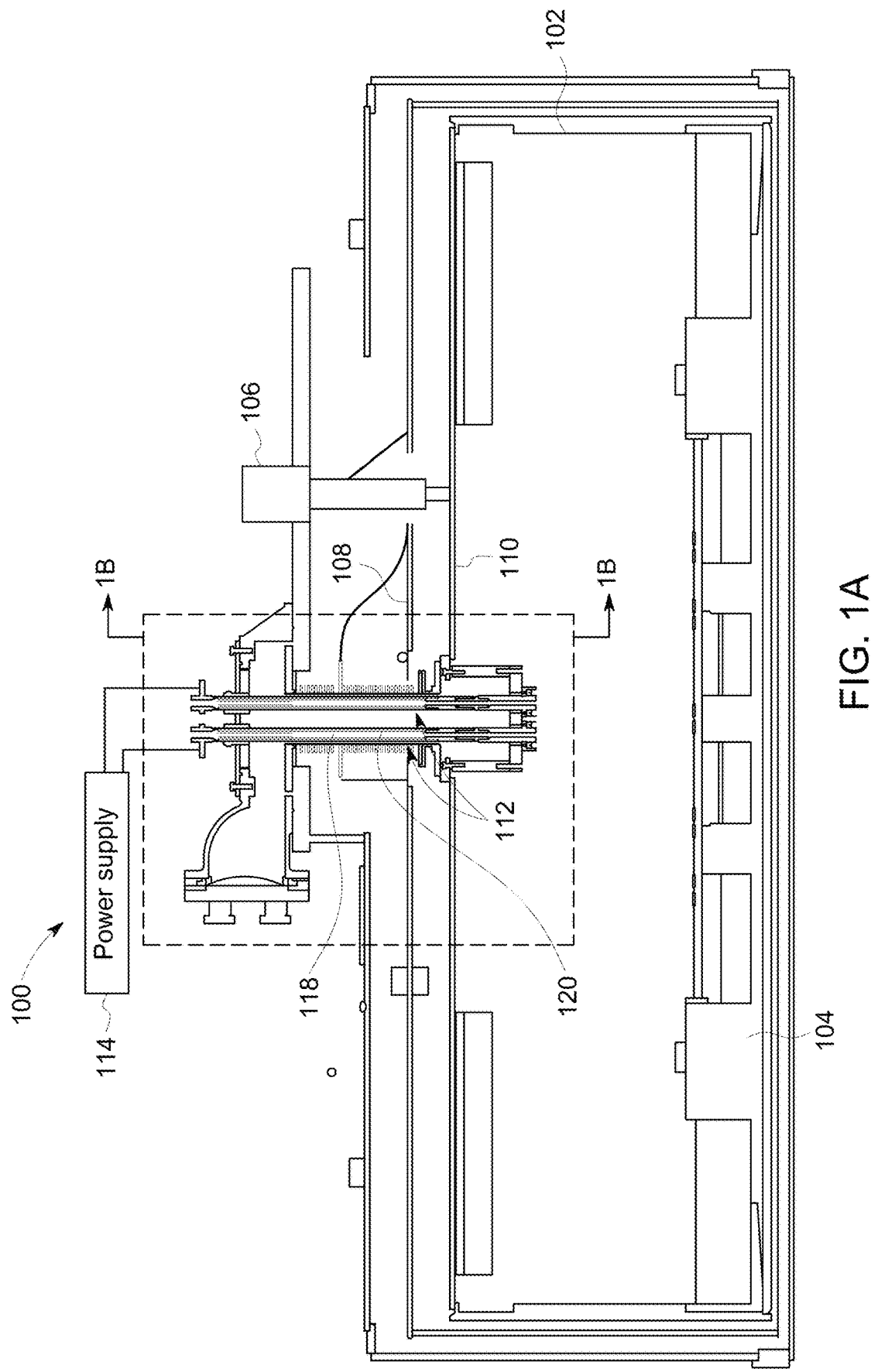
FIG. 1A is a schematic diagram of an exemplary cryogenic system.
Figure 1B:
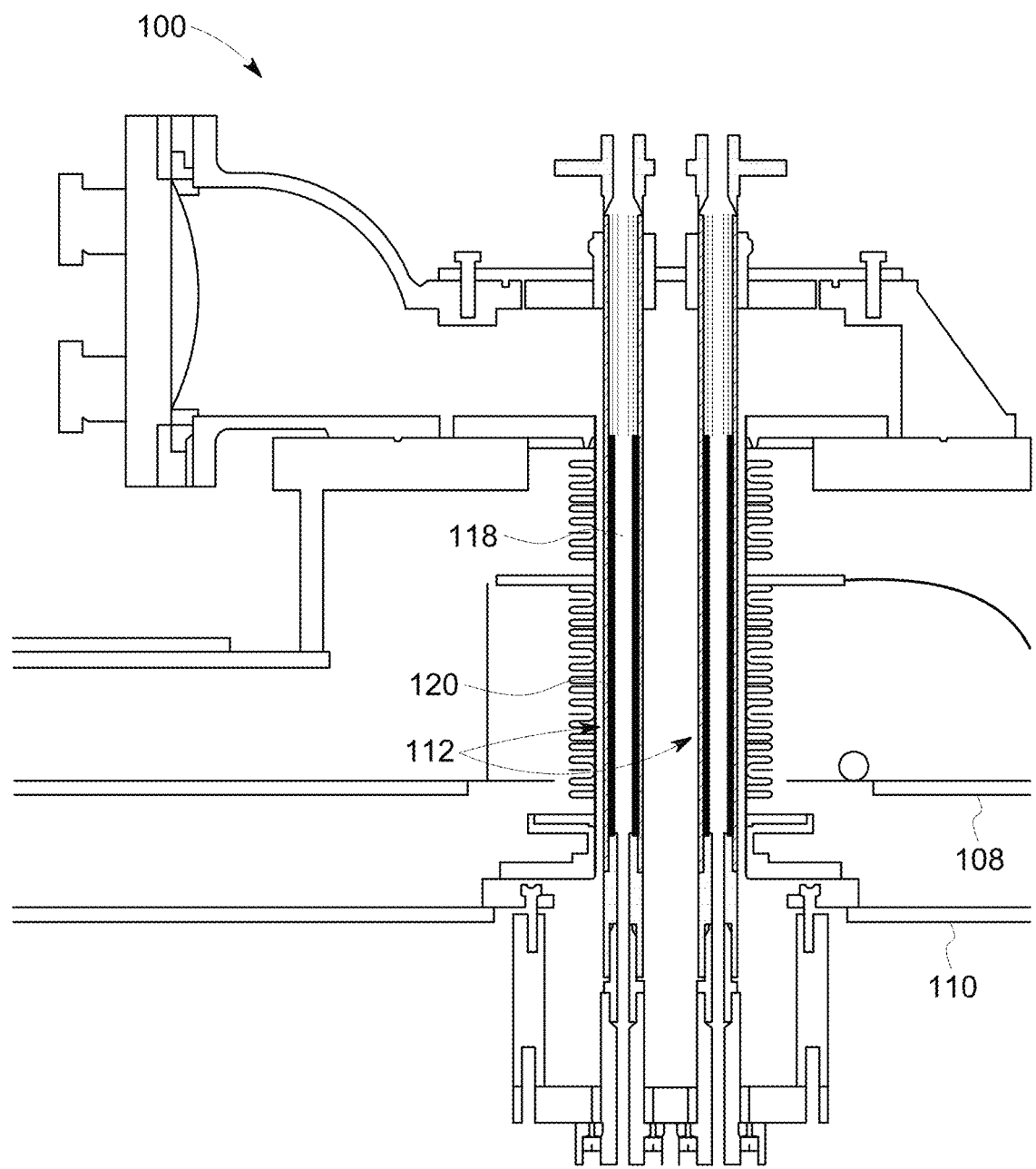
FIG. 1B is an enlarged view of a portion of the cryogenic system shown in FIG. 1A, and identified as 1B.

FIG. 1A shows an exemplary cryogenic system 100. FIG. 1B shows an enlarged view of the portion of the cryogenic system 100 marked in FIG. 1A. The cryogenic system 100 may include a vessel 102 containing a cryogenic apparatus 104. The cryogenic apparatus 104 may be a superconducting magnet used in a magnetic resonance imaging (MRI) system, nuclear magnetic resonance (NMR), or NMR high field magnet systems. In some embodiments, the cryogenic apparatus 104 may be motors, generators, fault current limiters, energy storage apparatus, particle accelerators, middle scale magnets, and lab use magnets. The superconducting magnet may include superconducting coils (not shown) that have wires of superconducting conductors and generate magnetic field by running electric current through the superconducting coils conductors. The superconducting magnet may be cooled by a cryogen, for example liquid helium having a boiling off temperature of 4.2 Kelvin (K), such that the cryogenic apparatus 104 is operated within a temperature range from approximately 4 K to approximately 10 K. Within this temperature range, the superconducting coils have no electrical resistance and do not generate heat from the electricity.

The cryogenic system 100 may further include a cold-head cryocooler 106. The depicted cold-head cryocooler 106 includes a first stage 108 and a second stage 110. The first stage 108 may have a higher operating temperature than the second stage 110. For example, the first stage 108 may have an operating temperature of approximately 50 K, and the second stage 110 may have an operating temperature of approximately 4 K. As a result, the vessel 102 is maintained at a temperature of approximately 4 K and the boil-off rate of the cryogen is reduced or limited.

In the exemplary embodiment, the cryogenic system 100 further includes a lead assembly 112. The lead assembly 112 is configured to electrically connect to a power supply 114, which is at a room temperature, and configured to supply electric current to the cryogenic apparatus 104. The lead assembly 112 is designed for a specific current carrying capacity. Two lead assemblies are included in the cryogenic system 100 to form a current loop with the cryogenic apparatus 104 and the power supply 114. The lead assembly 112 provides electrical contact between the cryogenic apparatus 104 at approximately 4 K and the power supply 114 at a room temperature of approximately 273 K or higher.

In a known cryogenic system, electric current for the cryogenic apparatus 104 is supplied through a removable lead assembly, which is inserted through an access neck to the vessel 102 and electrically connected to the cryogenic apparatus 104 during a ramping process of the cryogenic apparatus 104. For a superconducting magnet, a ramping process is a process to ramp up the magnetic field of the magnet from zero to a desired filed strength, such as 1.5 Tesla (T), 3T, or higher, where the current lead design changes with increased field strength and may require a heat exchanger redesign. After the cryogenic apparatus 104 reaches a desired status, for example, when the superconducting magnet reaches a desired magnetic field strength, the removable lead assembly is removed to avoid conducting heat into the vessel 102 and increase of the boil-off rate of the cryogen, because the lead assembly is also thermally conductive. The electrical connection between the removable lead assembly and the cryogenic apparatus 104 may be unreliable, and require additional measures to establish an effective electrical connection, such as including a permanent connection by soldering or clamping with fasteners or lubricating with relatively soft metal like indium. A removable assembly also has a large core that conducts excessive heat into the vessel 102, which boils off excessive amount of cryogen and increases the cost of ramping up the cryogenic apparatus 104. Further, inserting and removing the removable assembly introduces air into the vessel 102, causing serious icing in the vessel 102 and blocking access to the access neck or the electric terminal to the cryogenic apparatus 104.

In another known cryogenic system, the lead assembly is permanently mounted to or embedded with the access neck of the vessel 102. Known embedded lead assemblies, however, add permanent heat load to the vessel 102, increasing the boil-off rate of the cryogen in the vessel 102.

In the exemplary embodiment, the lead assembly 112 includes a high-temperature superconductor (HTS) assembly 118 (FIG. 1A). The HTS assembly 118 includes an HTS conductor 120. An HTS is a superconducting conductor having a critical superconducting temperature higher than absolute zero, for example having a critical superconducting temperature of approximately 90 K. A critical superconducting temperature is the highest temperature at which a material being superconductive to electric current. The HTS conductor 120 is, however, thermally non-conductive. Further, the HTS assembly 118 is constructed to be thermally nonconductive as a whole. The HTS assembly 118 may be, but does not need to be, coupled to the cold-head cryocooler 106. Because the HTS assembly 118 does not produce heat from electricity when operated at 50 K and is thermally nonconductive, the heat load to the vessel 102 through the HTS assembly 118 is limited at all times, which significantly reduces the boil-off rate of the cryogen. In some embodiments, when the lead assembly is not conducting electric current, the boil-off rate of the cryogen may be zero or near zero because the HTS assembly 118 is thermally nonconductive and the temperature of the HTS assembly 118 does not need to be maintained at or below the superconducting critical temperature as no current is flowing therethrough.

Figure 2:
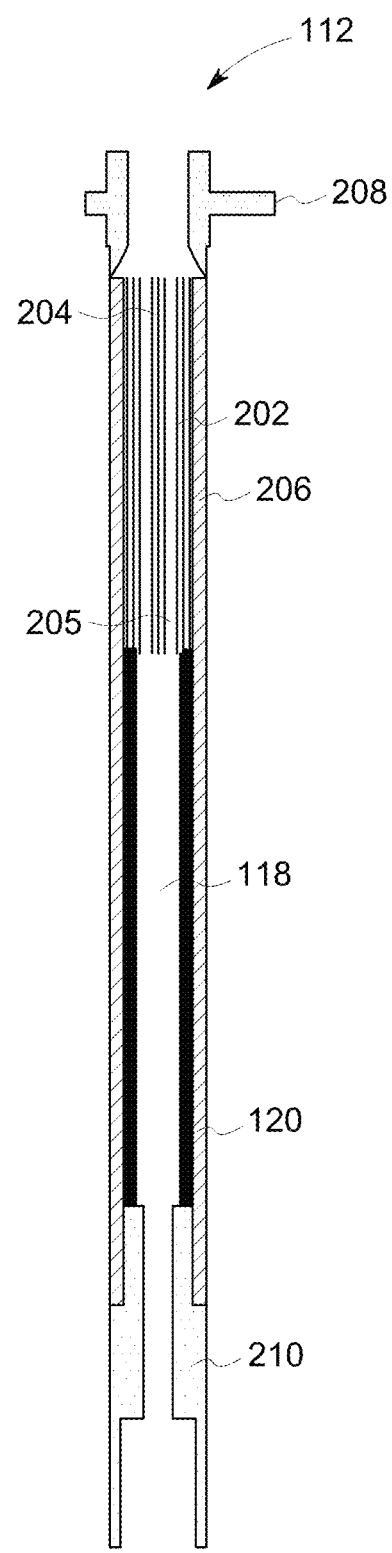
FIG. 2 is an exemplary lead assembly of the cryogenic system shown in FIG. 1A.

FIG. 2 shows the exemplary lead assembly 112. In addition to the HTS assembly 118, the lead assembly 112 includes a heat exchanger 202. The heat exchanger 202 is designed for a specific dwell time of the cryogen in the heat exchanger 202 and/or a specific pressure drop across the heat exchanger 202. The heat exchanger 202 includes a first end 204 and a second end 205. The heat exchanger 202 is composed of an electrically conductive and thermally conductive material such as copper, aluminum, copper alloy, aluminum alloy, composite, or ceramic. The heat exchanger 202 is configured to electrically connect to the power supply 114 at the first end 204. The heat exchanger 202 is coupled to the HTS assembly 118 at the second end 205. The heat exchanger 202 is configured to maintain the HTS assembly 118 at or below of the critical superconducting temperature of the HTS conductor 120 during ramping of the cryogenic apparatus 104. As a result, the lead assembly 112 does not need to be connected to the cold-head cryocooler 106, and reduces ramping cost of the cryogenic apparatus 104 from the reduced boil-off rate of the cryogen. Further, because the lead assembly 112 does not need to be connected to the cold-head cryocooler 106, the lead assembly 112 may be a stand-alone lead assembly, which may be controlled separately from the rest of the cryogenic system 100 and remotely controlled to auto ramp the cryogenic system 100 by remotely switching on power supply through controlling the lead assembly 112. In addition, the cooling mechanism of the lead assembly 112 is simplified, where both the heat exchanger 202 and the HTS 118 are cooled by cryogen, instead of separate cooling mechanisms for the heat exchanger 202 and the HTS 118 in conventional lead assemblies.

The lead assembly 112 further includes a sleeve 206 that encloses the heat exchanger 202 and the HTS assembly 118. The lead assembly 112 may further include an upper connector 208 and a lower connector 210. The upper connector 208 and the lower connector 210 are composed of electrically conductive material such as brazed copper. The upper connector 208 is configured to electrically connect to the power supply 114 and couple to the heat exchanger 202 at the first end 204 of the heat exchanger. The lower connector 210 is configured to electrically connect to and supply electrical power to the cryogenic apparatus 104. The lower connector 210 is coupled to the HTS assembly 118 and electrically connected to the HTS conductor 120 of the HTS assembly 118.

In operation, during ramping, the lead assembly 112 is electrically connected to the power supply 114 and supplies electric current to the cryogenic apparatus 104. Electric connection between the power supply 114 and the cryogenic apparatus 104 is established through the upper connector 208, the heat exchanger 202, the HTS conductor 120 of the HTS assembly 118, and the lower connector 210. Once ramping is completed, the power supply 114 is disconnected from the lead assembly 112. Because the HTS assembly 118 is not thermally conductive, heat load to the vessel 102 is limited. As a result, the lead assembly 112 can be embedded with the vessel 102, causing little boil-off of the cryogen.

Figure 3A:
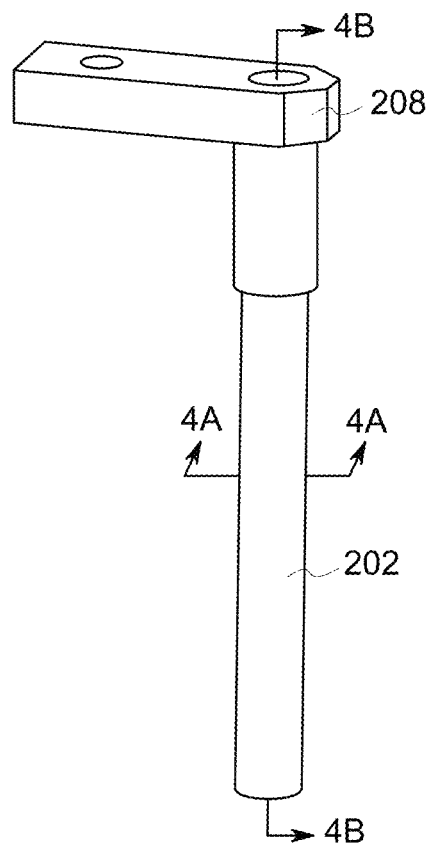
FIG. 3A is a side view of a heat exchanger of the heat exchanger shown in FIG. 2 coupled to an upper connector.
Figure 3B:
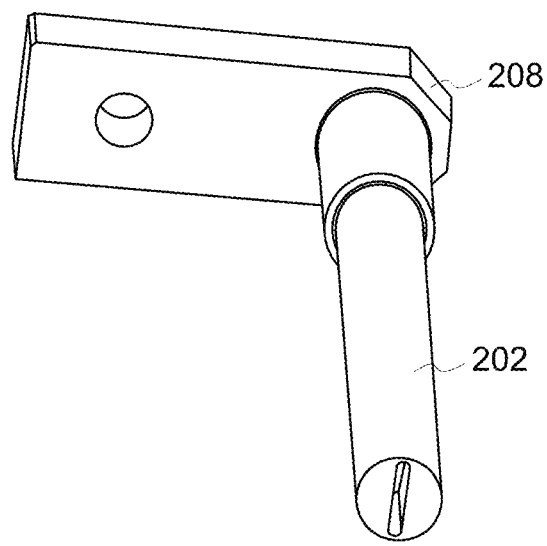
FIG. 3B is a bottom perspective view of the heat exchanger and the upper connector shown in FIG. 3A.
Figure 3C:
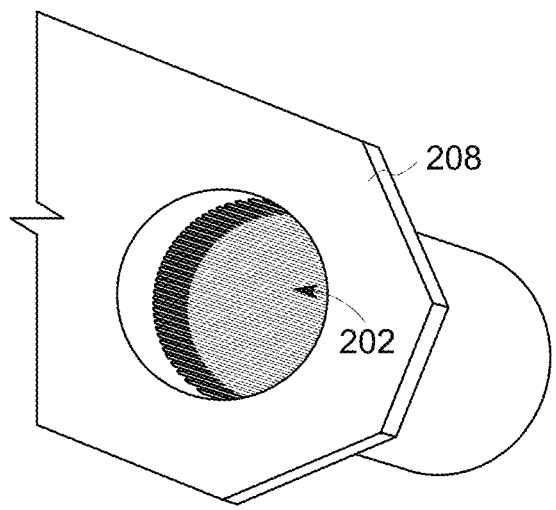
FIG. 3C is a portion of the top perspective view of the heat exchanger and the upper connector shown in FIG. 3A.
Figure 4A:
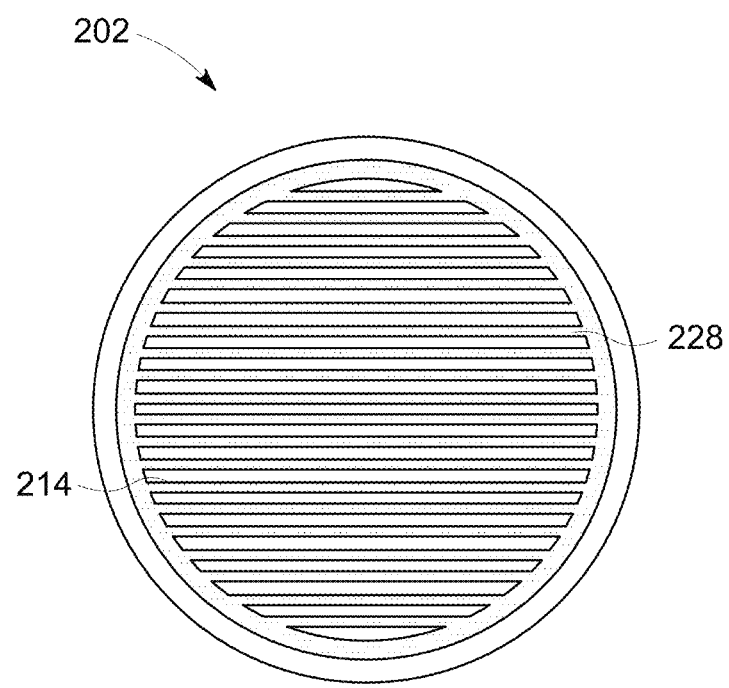
FIG. 4A is a sectional view taken along line 4A-4A in FIG. 3A.
Figure 4B:
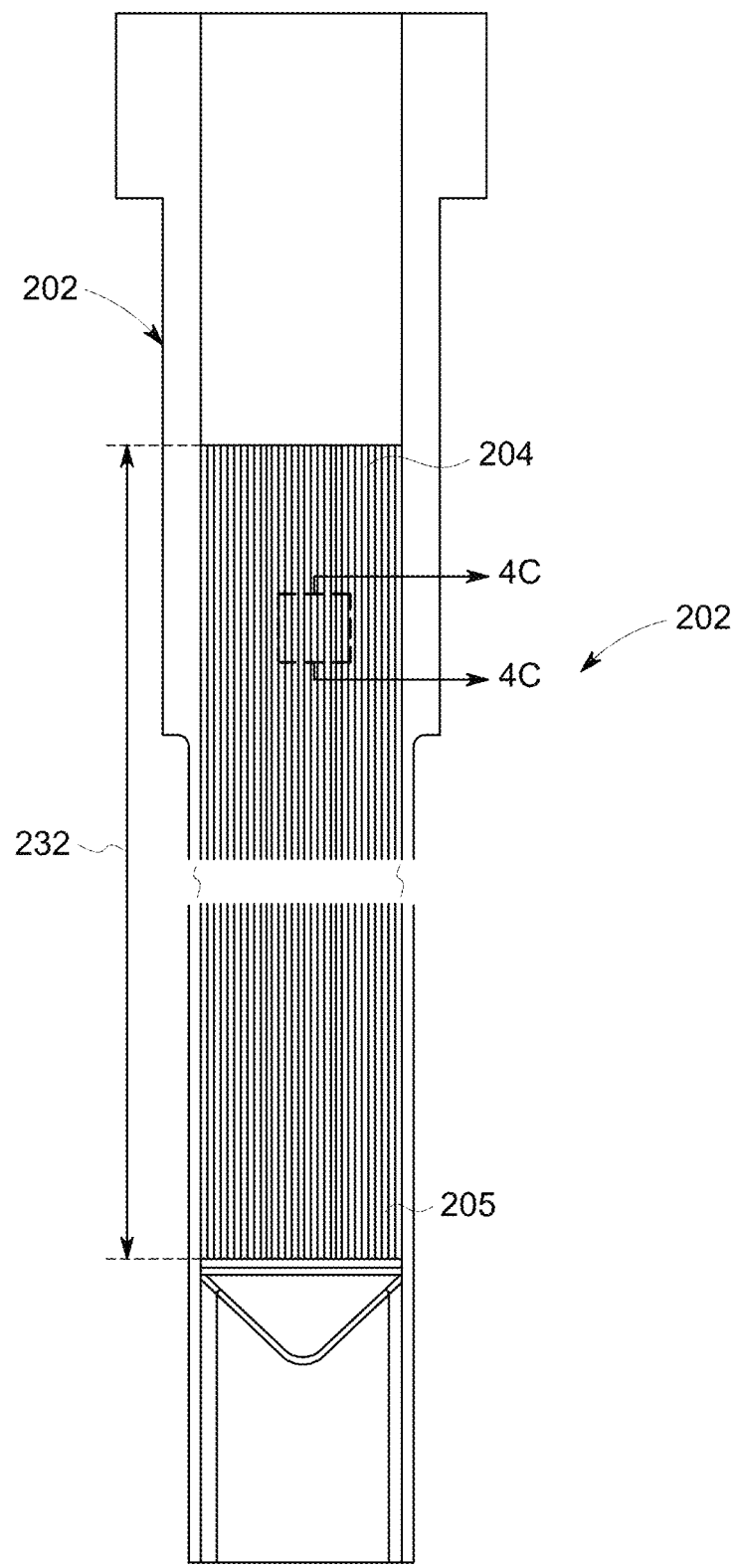
FIG. 4B is a sectional view taken along line 4B-4B in FIG. 3A.
Figure 4C:
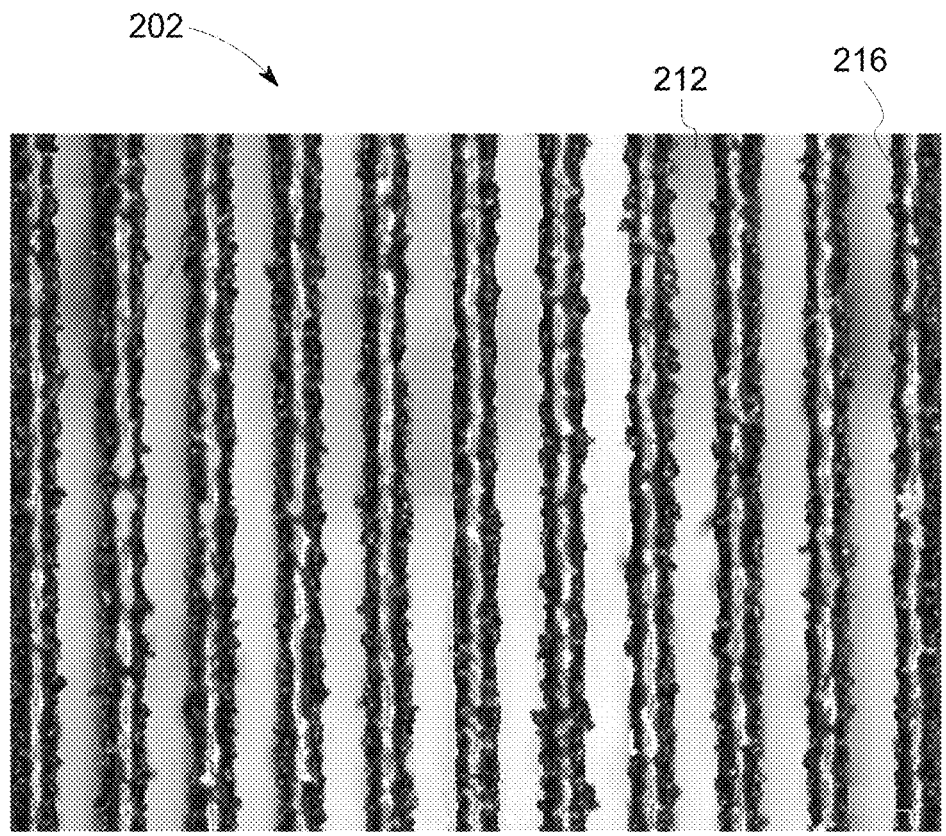
FIG. 4C is an enlarged view of a portion of a portion of the cross section of the heat exchanger and the upper connector identified in FIG. 4B.

FIGS. 3A-3C show a side view (FIG. 3A), a lower perspective view (FIG. 3B), and a top perspective view (FIG. 3C) of the exemplary heat exchanger 202 coupled to the exemplary upper connector 208. FIGS. 4A-4C show cross-sectional views of the heat exchanger 202. FIG. 4A shows an axial cross-sectional view of the heat exchanger 202 along transverse cross-sectional line 4A-4A in FIG. 3A. FIG. 4B shows a longitudinal cross-sectional view of the heat exchanger 202 along cross-sectional line 4B-4B. FIG. 4C is an enlarged view of a portion of FIG. 4B.

In the exemplary embodiment, the heat exchanger 202 includes a plurality of channels 212. In one example, the channels are formed by fins 228. The channels 212 extend longitudinally through the heat exchanger 202 from the first end 204 of the heat exchanger 202 to the second end 205 of the heat exchanger 202. Vapor and/or heat flows through the channels 212 to/from the exterior of the lead assembly 112 and the HTS assembly 118. The channels 212 are illustrated in the transverse cross section 214 in FIG. 4A. The channels 212 also define thermal surfaces 216 to be in contact with vapor. At the first end 204 of the heat exchanger 202, solid structures such as fins 228 on the cross section 214 impedes the flow of vapor in and out of the heat exchanger. The thermal surfaces 216 of the channels 212, on the other hand, facilitate the heat exchange between the vapor and the heat exchanger. Accordingly, the configuration and combination of channels and the area of the cross section 214 is designed to enable controlled vapor flow with reduced pressure drop and increased surface area of the thermal surface for the heat exchange. Such a design increases the heat exchange efficiency of the heat exchanger 202. In some embodiments, the area of the cross section 214 is minimized and the thermal surfaces 216 are maximized. In one example, the thermal surfaces 216 may be roughened or unpolished to have increased roughness to further increase the thermal surfaces 216 and also introduce turbulence for increased convection of heat.

Figure 5A:
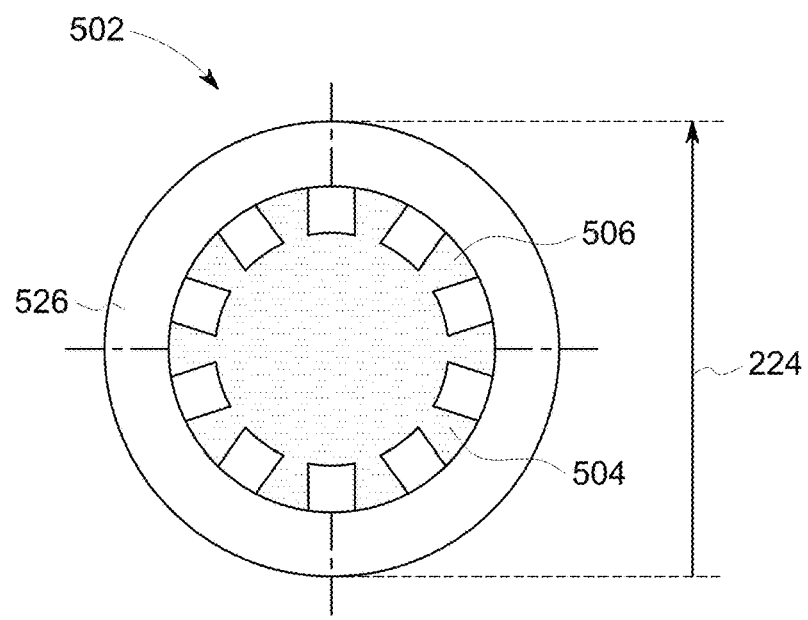
FIG. 5A is a cross section of a known current lead.
Figure 5B:
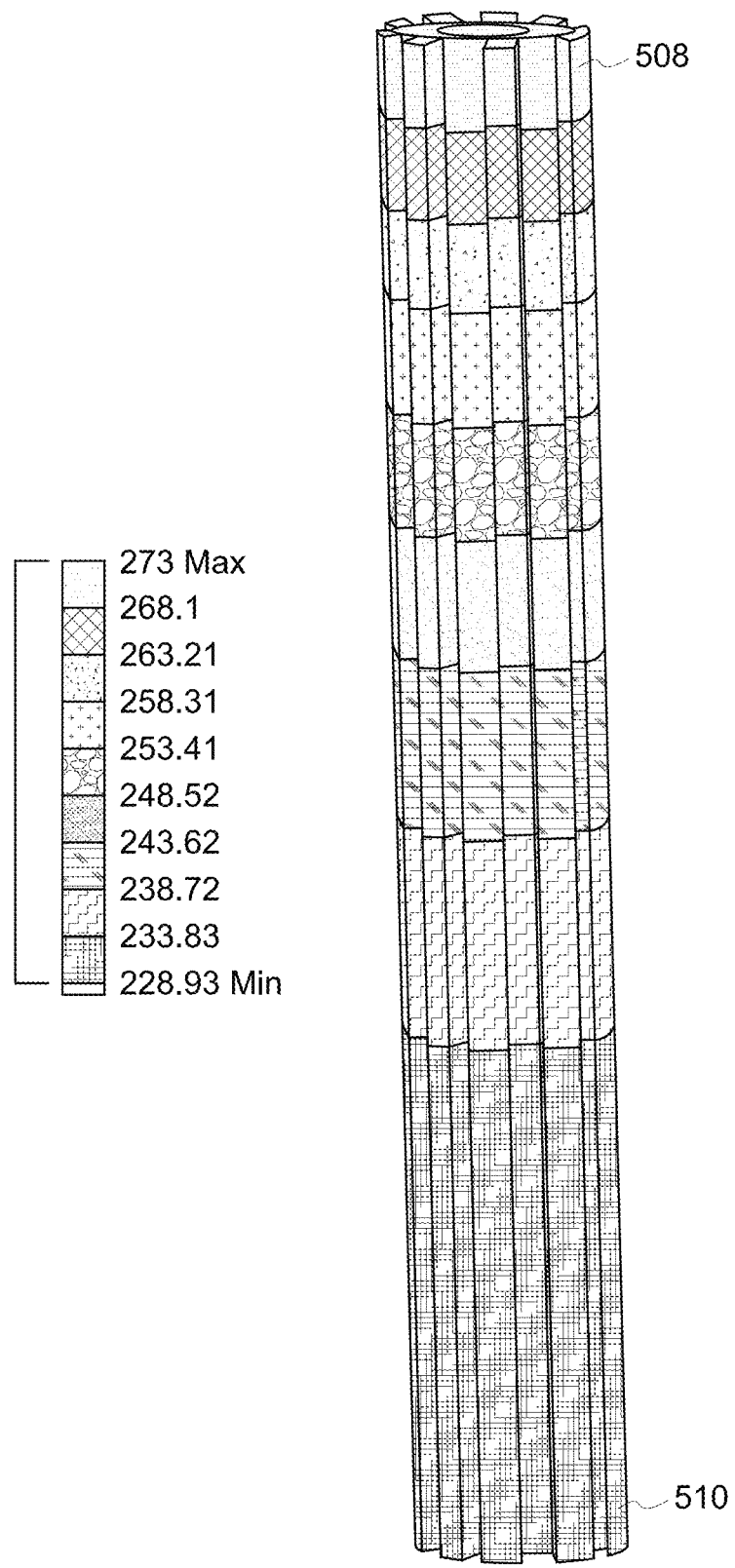
FIG. 5B shows thermal performance of the known current lead shown in FIG. 5A.
Figure 5C:
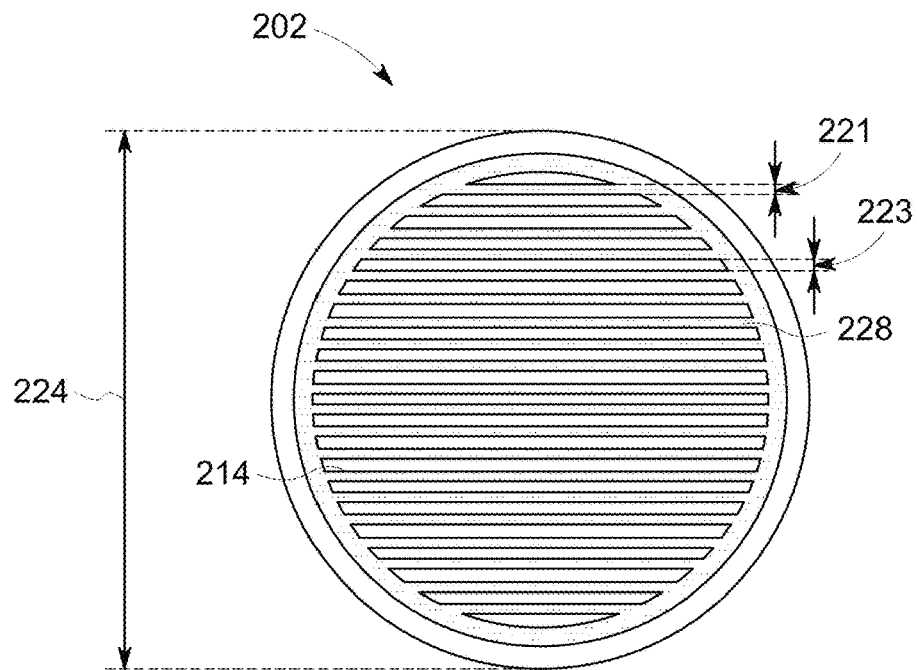
FIG. 5C is a sectional view of the heat exchanger shown in FIG. 3A taken along line 4A-4A.
Figure 5D:
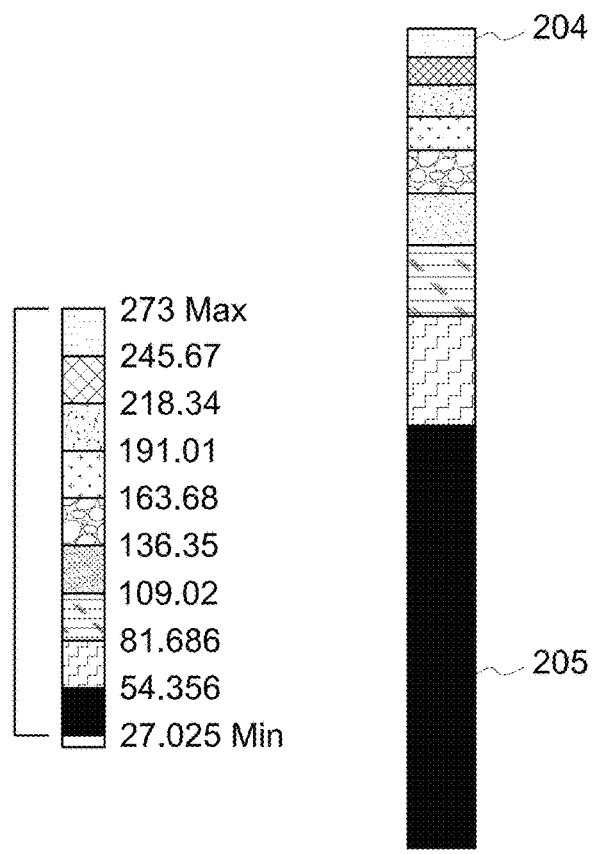
FIG. 5D shows thermal performance of the heat exchanger shown in FIG. 3A.

FIGS. 5A-5D show a contrast between the thermal performance of a known current lead 502 with a cross section 526 and the heat exchanger 202 disclosed herein. FIG. 5A shows the cross section 526 of the known current lead 502 and FIG. 5B shows thermal performance of the known current lead 502. FIG. 5C shows the cross section 214 of the heat exchanger 202 and FIG. 5D shows thermal performance of the heat exchanger 202. FIGS. 5B and 5D are results of a computer simulation, such as a finite element analysis (FEA), that models the thermal performance of heat exchangers 202, 502. The known current lead 502 includes ten, equally-spaced grooves 504 along an interior 506 of the known current lead 502. In contrast, the heat exchanger 202 includes a plurality of fins 228. The cross section 214 of the heat exchanger 202 depicted in FIG. 5C is not to scale. The temperature of the heat exchangers 202, 502 at the first end 204, 508 is set as 273 K. The outer diameters 224 of the cross section 526 of the known current lead 502 and of the cross section 214 of the heat exchanger 202 are kept the same. The heat exchangers 202, 502 have the same length 232 (see FIG. 4B). Both of the heat exchangers 202, 502 are cooled by gaseous helium at a rate of 6.25 liter/hour (L/hour). As shown in FIG. 5B, the temperature of the known current lead 502 at the second end 510 is approximately 228 K. In contrast, the temperature of the heat exchanger 202 at the second end 205 is approximately 27 K, which is suitable for the HTS conductor 120 to operate at a superconducting condition. The length 232, the outer diameter 224, and channel sizes may be adjusted, depending on applications such as temperatures at the first end 204 and the second end 205.

Figure 6A:
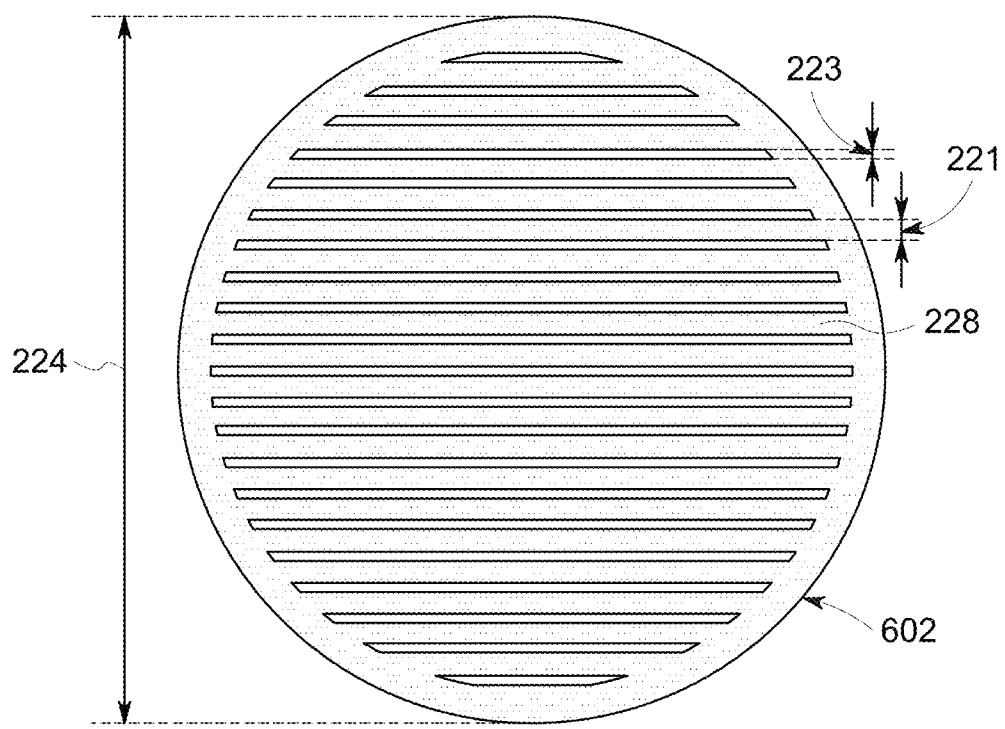
FIG. 6A is another exemplary cross section of the heat exchanger shown in FIG. 3A.
Figure 6B:
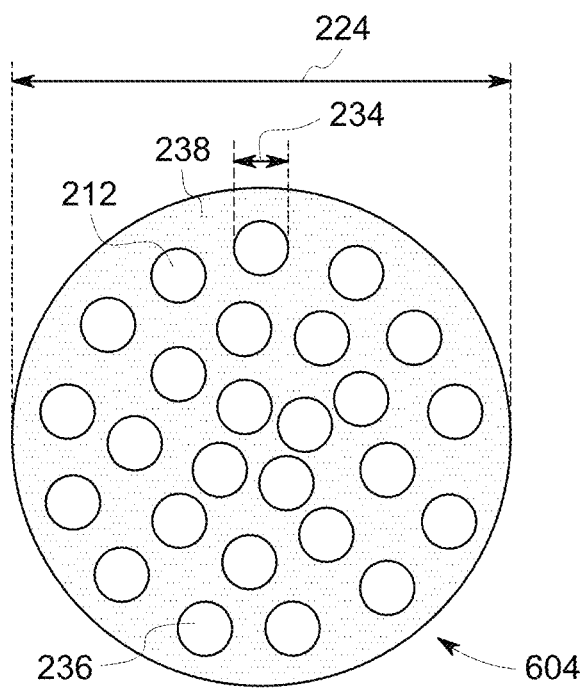
FIG. 6B is one more exemplary cross section of the heat exchanger shown in FIG. 3A.

FIGS. 6A and 6B show designs of cross sections of the heat exchanger 202. In the examples shown in FIGS. 6A and 6B, the outer diameter 224 of cross sections 602, 604 of the heat exchangers 202 are the same. In FIG. 6A, the heat exchanger 202 has a similar design as the heat exchanger 202 shown in FIG. 5C, where the heat exchanger 202 includes fins 228 with gaps 223 between the fins 228, except the thickness 221 of fins 228 is smaller and the gap 223 between adjacent fins 228 is greater for the heat exchanger 202 shown in FIG. 6A than the heat exchanger 202 shown in FIG. 5C. The thickness 221 and the gap 223 may be in other dimensions that enable the heat exchanger 202 to function as disclosed herein. In FIG. 6B, the heat exchanger 202 has channels 212 with cylindrical configurations, which shown as circular holes 212 in the transverse cross section 604. The ratio of the total void area 236 to the total solid area 238 in the cross section 604 is chosen to optimize the thermal performance of the heat exchanger. The total void area 236 is the total area of the cross section 604 that is occupied by all of the holes 212. The total solid area 236 is the total area of the cross section 604 that is not occupied by the holes 212. One example of the ratio is approximately 1:2 or 0.5. In some embodiments, the heat exchanger 202 may have approximately 100 holes on the cross section 604. The diameter 234 of the hole 212 and the ratio of the total void area 236 to the total solid area 238 may vary, depending on the thermal performance requirements of the heat exchanger 202.

Figure 7A:
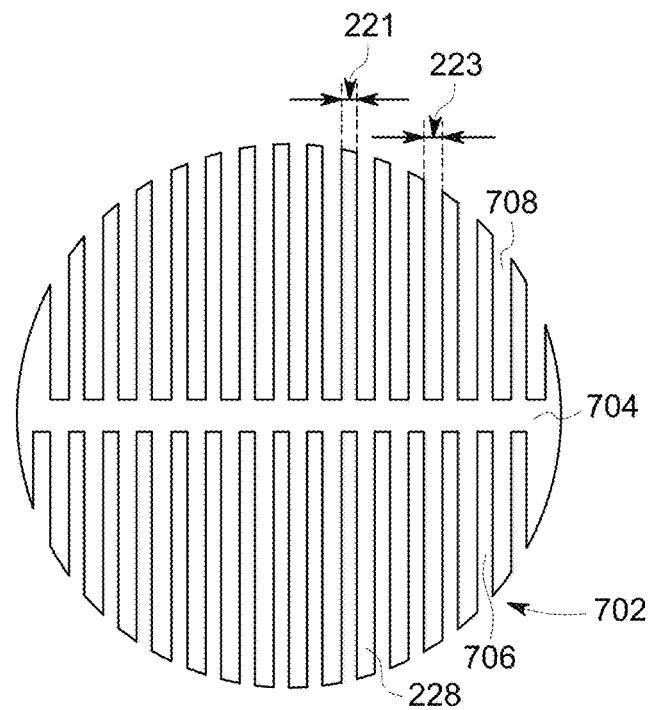
FIG. 7A is one more exemplary cross section of the heat exchanger shown in FIG. 3A.
Figure 7B:
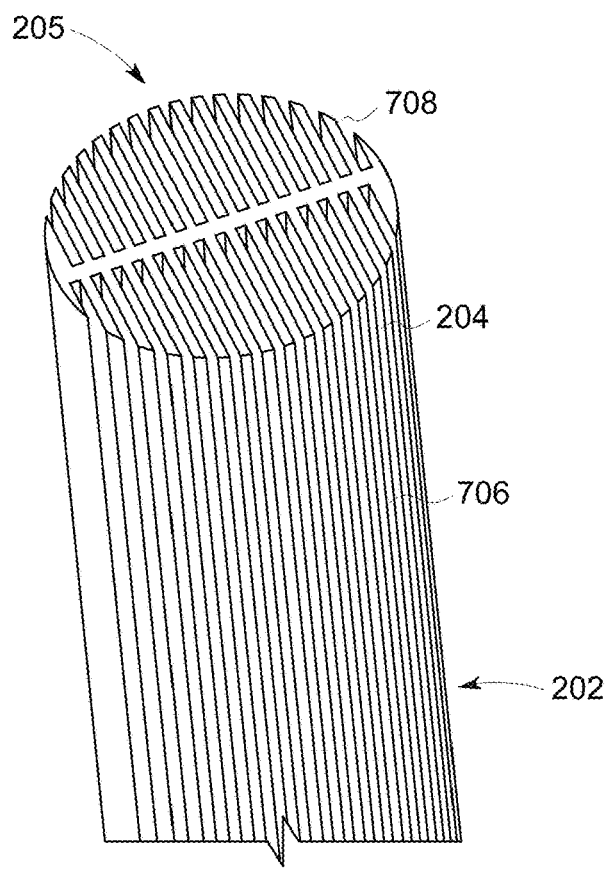
FIG. 7B is a perspective view of part of the heat exchanger shown in FIG. 7A.

FIGS. 7A and 7B show another exemplary design of the heat exchanger 202. FIG. 7A shows a cross section 702 of the heat exchanger 202. FIG. 7B shows a perspective view of part of the heat exchanger 202. Different from the heat exchanger 202 shown in FIGS. 5C and 6A, the heat exchanger 202 further includes a partition 704 extending longitudinally from the first end 204 to the second end 205 and laterally to divide the heat exchanger 202 into a first section 706 and a second section 708. The fins 228 extend from the partition 704 of the cross section 702. The thickness 221 and gaps 223 of fins 228 in the first section 706 and the second section 708 may be the same, or may be different. The location and orientation of the fins 228 extending from the partition 704 in the first and second sections 706, 708 may result in the fins being interleaved such that fins 228 in the first section 706 extend from the partition 704 at locations of the gaps 223 in the second section 708, and vice versa. A heat exchanger 202 with interleaved fins is relatively easier to manufacture with conventional processes, such as machining, than a heat exchanger 202 with fins that are not interleaved.

Figure 8:
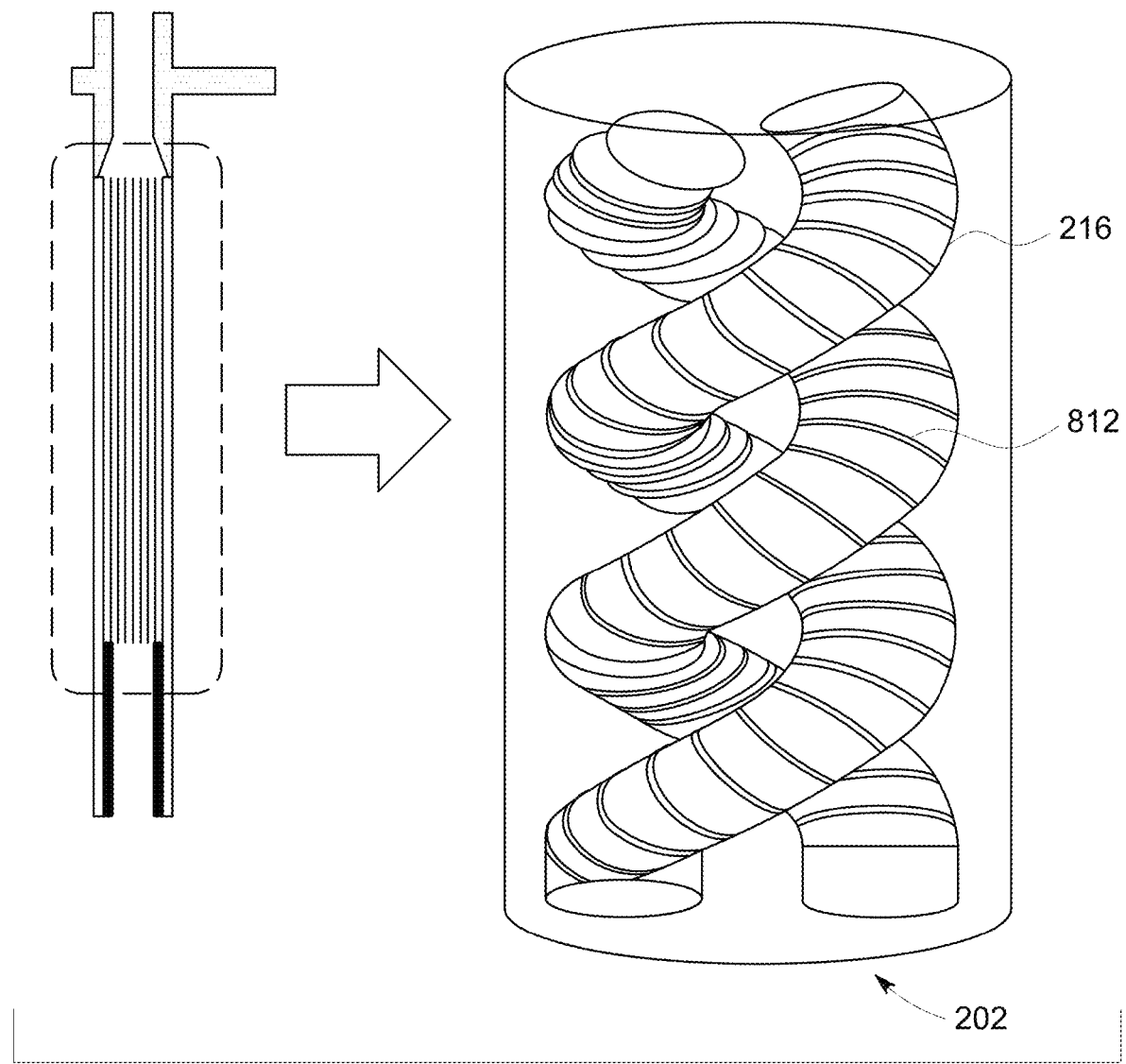
FIG. 8 shows another exemplary design of the heat exchanger according to an aspect of the disclosure.
Figure 9A:
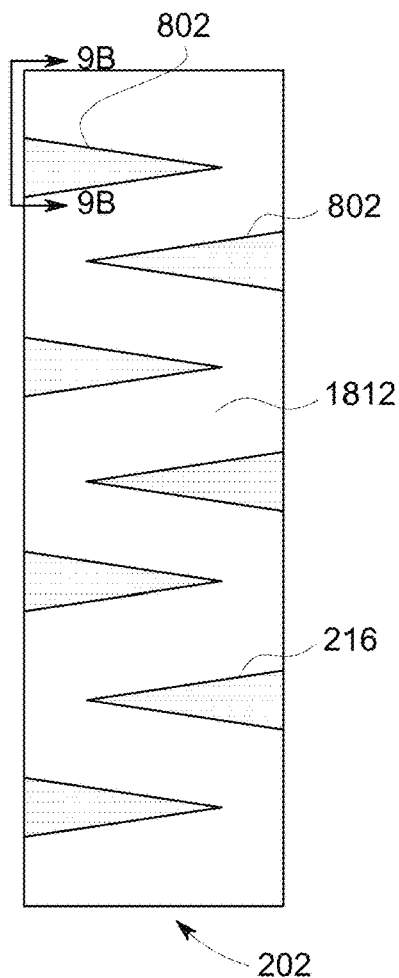
FIG. 9A shows one more exemplary design of the heat exchanger according to an aspect of the disclosure.
Figure 9B:
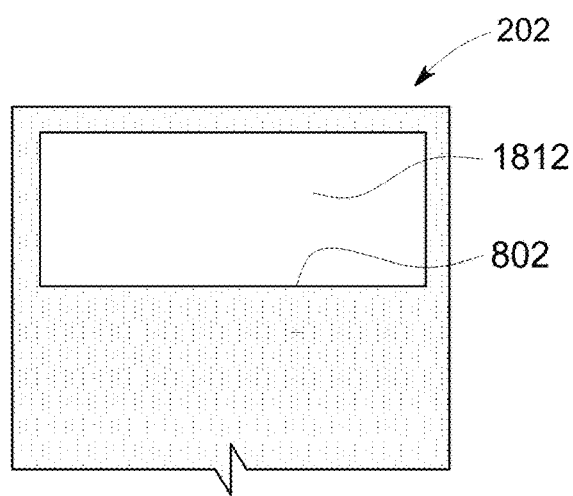
FIG. 9B is a partial cross sectional view of the head exchanger shown in FIG. 9A along line 9B-9B.

FIGS. 8, 9A, and 9B show more exemplary designs of the heat exchanger 202. The heat exchanger 202 may include spiral channels 812 (FIG. 8). Spiral channels 812 increase the surface area afforded by thermal surfaces 216, when contrasted with the surface area provided by the channels in previously described exemplary heat exchangers having straight channels 212. Although two spiral channels 812 are shown in FIG. 8, the number of spiral channels 812 may be one, three, or other numbers that enable the heat exchanger 202 to function as disclosed herein. FIGS. 9A and 9B show the heat exchanger 202 having zigzagged channels 1812. FIG. 9A shows a longitudinal cross sectional view of the heat exchanger 202. FIG. 9B shows a partial longitudinal cross sectional view along line 9B-9B in FIG. 9A. In FIGS. 9A and 9B, the heat exchanger 202 includes a plurality of baffles 802. The baffles 802 are inside the heat exchanger 202 and extend inwardly and partially transversely across the interior of the heat exchanger 202, in alternating transverse directions to produce the zigzag path through the heat exchanger 202, forming zigzagged channels 1812. If one zigzagged channel 1812 is included, the channel 1812 may be as wide as the inner transverse cross section of the heat exchanger 202 (see FIG. 9B). Zigzagged channels 1812 also increase thermal surfaces 216 of the heat exchanger 202 relative to straight channels 212. Although one zigzag channel is shown and described, the heat exchanger 202 may include one, two, three, or other number of zigzagged channels 1812 that enable the heat exchanger 202 to function as described herein. The heat exchanger 202 may be cylindrical, or in other shapes, such as cuboids (FIGS. 9A and 9B).

The heat exchanger 202 may be manufactured by traditional metal manufacturing processes, such as sintering, casting, machining, and metal injection molding. Compared to traditional metal manufacturing processes, the adjustment and fine tuning of the design of the heat exchanger 202 using additive manufacturing processes may be achieved without the challenges associated with traditional manufacturing methods that require complicated changes to casts, mold, or the manufacturing system.

Figure 10:
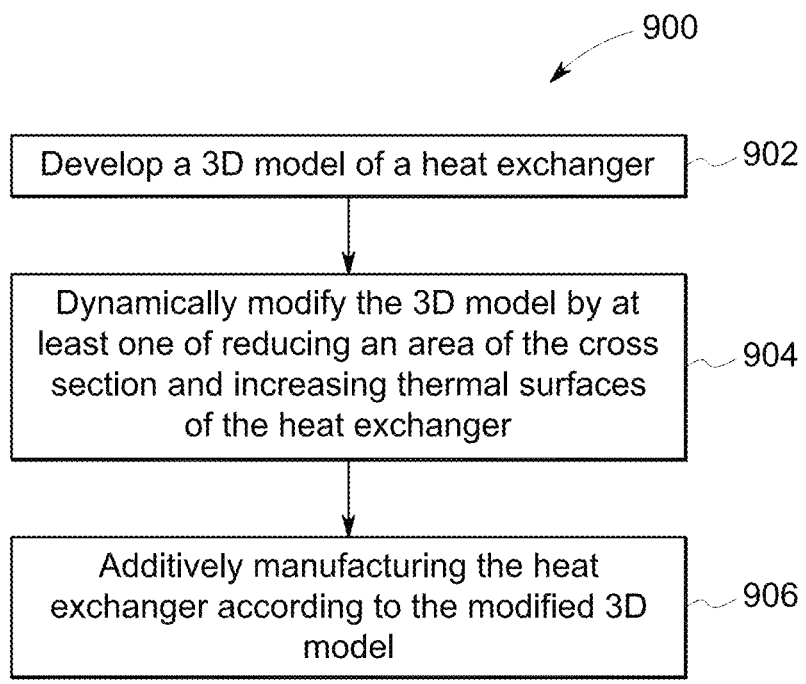
FIG. 10 shows a flow chart of an exemplary method of manufacturing a heat exchanger.

FIG. 10 is a flow chart of an exemplary method 900 of additively manufacturing a heat exchanger. Additive manufacturing is also called 3D printing. In additive manufacturing, a 3D object is manufactured based on a 3D model. The 3D model may be a computer-aided design (CAD) model. After the 3D model is provided to an additive manufacturing system, the system produces 3D objects based on the 3D model with material being added together, such as liquid molecules or powder grains being fused together, typically layer by layer. In the exemplary embodiment, the method 900 includes developing 902 a three-dimensional (3D) model of a heat exchanger. The heat exchanger is any of the exemplary heat exchangers 202 disclosed herein. The method 900 may further include dynamically modifying 904 the 3D model. The 3D model is modified to meet the performance requirements of the environment where the heat exchanger will be used. One or more structural features of the 3D model may be modified to achieve the desired heat exchanger performance. The 3D model may be modified by reducing a cross-sectional area of the heat exchanger such as reducing the thickness of the fins in the heat exchanger. The thermal surfaces of the heat exchanger may be increased during the adjustment. The shape of channels in the heat exchangers may be changed during the adjustment. The cross sectional area and thermal surfaces of the heat exchanger are two key factors affecting the heat exchange efficiency of the heat exchanger. Reducing the cross sectional area and/or increasing thermal surfaces increases the heat exchange efficiency of the heat exchanger. Accordingly, the 3D model of the heat exchanger may be modified by minimizing the cross-sectional area and/or maximizing the thermal surfaces. In some embodiments, the heat exchanger and the upper connector may be manufactured as a single unitary component by an additive manufacturing process.

In one embodiment, a base design including any of the heat exchangers described herein is provided. Thermal performance of the heat exchanger is simulated and estimated in an FEA program. The heat exchanger is then printed with a 3D additive manufacturing process and tested in a cryogenic system. The test results and simulation results are compared to evaluate whether the simulation represents the thermal performance of the heat exchanger within a specified tolerance level. If a specified tolerance level is met, the simulation may be used to dynamically modify the design of the heat exchanger in the simulation, before printing another heat exchanger. The process of designing, simulation, sample testing, and improving design may be repeated. The design of the heat exchanger may be bounded by limitations of 3D printing, such as minimum feature thickness, minimum gap distance, and feature vertical angles. Spiral and/or zigzagged channels may be included in the heat exchanger to further increase thermal exchange.

In the exemplary embodiment, the method 900 further includes additively manufacturing 906 the heat exchanger according to the modified 3D model. Exemplary additive manufacturing processes may be electron-beam additive manufacturing or selective laser melting. The manufactured heat exchanger may be tested to see if it meets the required thermal performance, for example, where the temperature of the heat exchanger at the second end to be 50 K or below under a certain condition. For example, the heat exchanger may be tested by including it in a cryogenic system and monitoring the temperature at the second end of the heat exchanger. In some embodiments, the heat exchanger may be tested by a computer simulation, such as an FEA analysis that simulates the thermal performance of the heat exchanger in a cryogenic system. If the heat exchanger does not meet the required thermal performance, the 3D model is adjusted by reducing the cross section, increasing thermal surfaces, and/or changing the shapes or designs of the channels. Testing and modifying may be repeated until the heat exchanger meets the required thermal performance.

An additive manufacturing process allows fine tuning of the heat exchanger, e.g., with respect to required surface area. Once a suitable 3D model is designed, a conventional manufacturing method such as sintering or metal gauze may be used to manufacture the lead assemblies, using the 3D model.

Figure 11A:
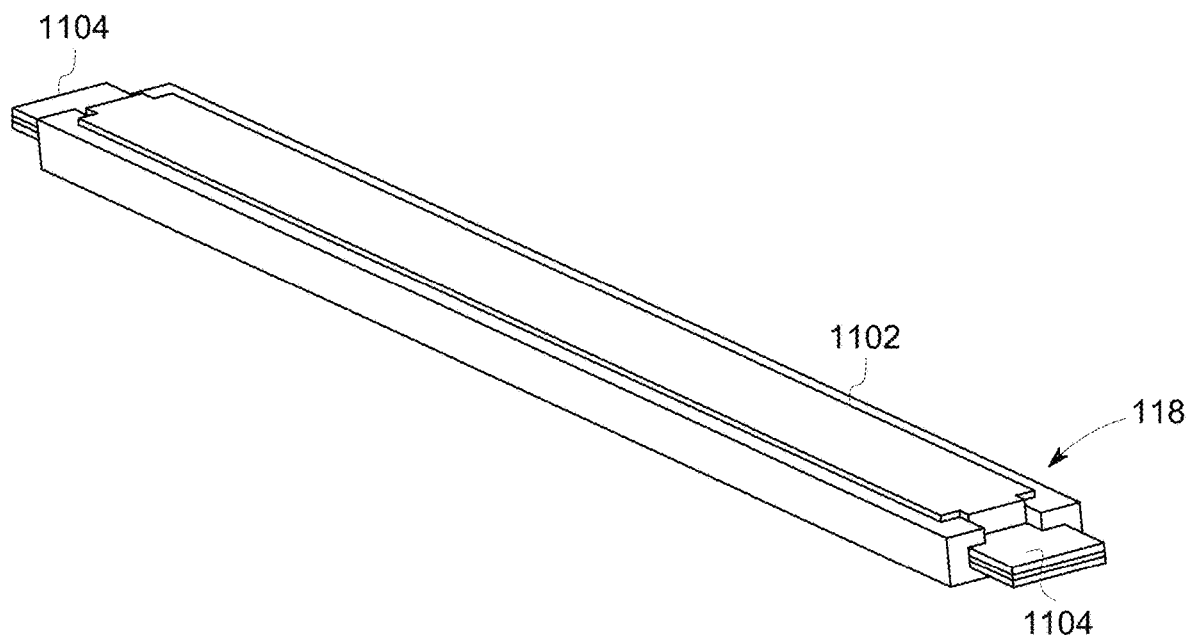
FIG. 11A is a perspective view of an exemplary lead assembly of the cryogenic system shown in FIG. 1A.
Figure 11B:
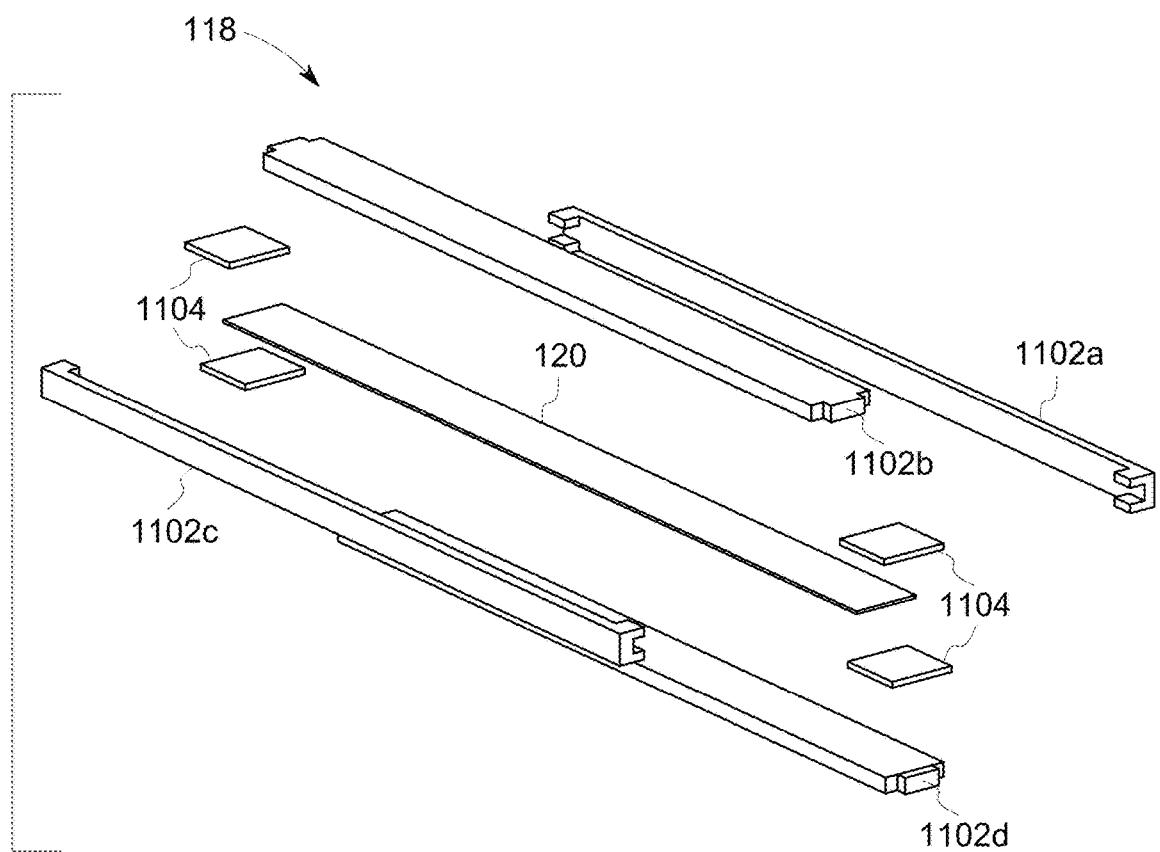
FIG. 11B is an exploded view of the exemplary lead assembly shown in FIG. 11A.

FIG. 11A shows an exemplary HTS assembly 118 for the lead assembly 112. FIG. 11B shows an exploded view of the HTS assembly 118. The HTS conductor 120 included in the HTS assembly 118 may be an HTS strip 120. The HTS assembly 118 may further include an enclosure 1102. The enclosure 1102 may include separate portions 1102a-1102d. The enclosure 1102 is composed of an electrically nonconductive and thermally nonconductive material. An exemplary material is G-10. The HTS assembly 118 may further include terminals 1104. The terminals 1104 are electrically connected to the HTS conductor 120 at each end of the HTS conductor 120 and provide electrical connection for the HTS conductor 120. The terminals 1104 are comprised of an electrically conductive material, such as copper.

To assemble a HTS assembly, portions 1102a-1102d of the enclosure may be clamped together to enclose the HTS conductor 120 therein and hold the terminals 1104 with ends of the HTS conductor 120. The terminals 1104 may be soldered or clamped with pressure to the end of the HTS conductor 120. The enclosure 1102 protects the HTS conductor 120 from vibration caused by vapor flow. The enclosure 1102 also provides a rigid structure to maintain the shape of the HTS conductor 120.

Figure 12A:
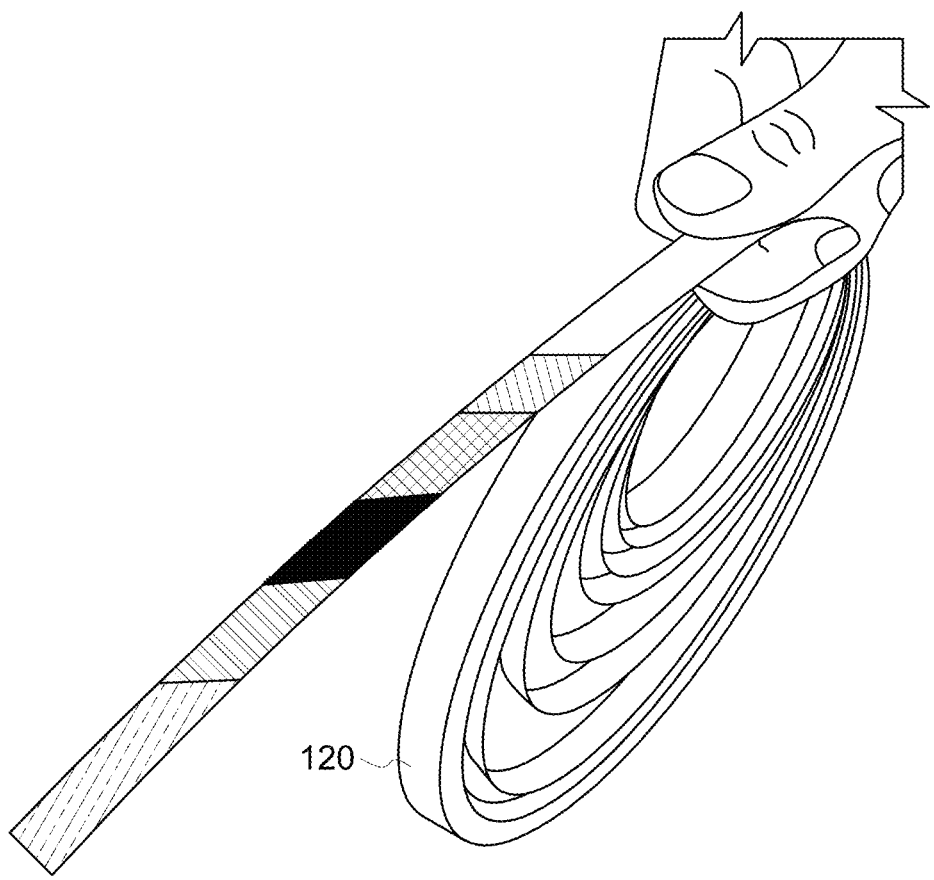
FIG. 12A is an exemplary high temperature superconductor (HTS) strip.
Figure 12B:
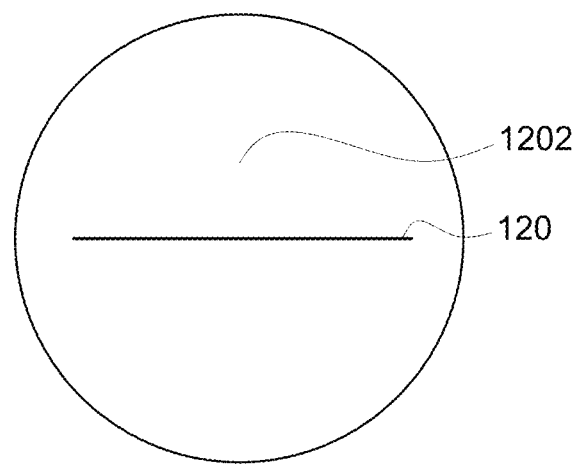
FIG. 12B shows a comparison between the HTS strip shown in FIG. 12A and a copper conductor.

FIGS. 12A-12B show an exemplary HTS conductor 120 and comparison with a copper conductor. The HTS conductor 120 is a HTS strip (FIG. 12A). The HTS conductor 120 may be a rare-earth barium copper oxide (ReBCO) coated conductor. The HTS conductor 120 conducts electricity at a superconducting condition at a temperature higher than absolute zero (0 K), for example approximately 50-60 K. At a superconducting condition, the HTS conductor 120 does not have electrical resistance and does not generate heat from electricity. Compared to a conventional conductor such as a copper conductor 1202, the HTS conductor enables a more compact design of current lead assemblies that may be more effectively coupled with the heat exchanger designs developed through the processes described herein, than traditional copper conductors 1202. The copper conductors are bulky and the HTS conductor requires a smaller volume of material than a copper conductor 1202 to carry the same amount of current (see FIG. 12B). The HTS conductor 120 is much lighter than the copper conductor 1202 for carrying the same amount of current. Further, compared to the copper conductor 1202 which conducts both electricity and heat, the HTS conductor 120 has a much smaller thermal conductivity than the copper conductor 1202. For example, at a cryogenic temperature, the copper conductor 1202 has a thermal conductivity of more than 1000 W/m·K, while the HTS conductor 120 has a thermal conductivity of approximately 10-20 W/m·K. Therefore, heat transferred through the HTS conductor 120 to the cryogenic apparatus 104 is limited.

In the exemplary embodiment, during ramping of the cryogenic apparatus 104, the amount of current flowing through the HTS conductor 120 may be more than 1000 Ampere (A). If the temperature of surrounding the HTS conductor 120 reaches above the superconducting critical temperature for the HTS conductor 120, the HTS conductor 120 does not operate under a superconducting condition and instead operates under a regular condition, where the HTS conductor 120 has electrical resistance. With current as high as more than 1000 A flowing through the HTS conductor 120, a large amount of heat from electricity will be generated, which may damage or burn out the HTS conductor 120.

Figure 13A:
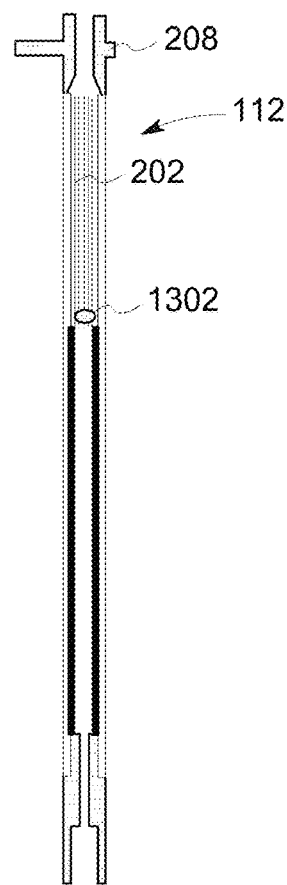
FIG. 13A is an exemplary lead assembly implemented with a mechanism of protecting the HTS conductor of the lead assembly.
Figure 13B:
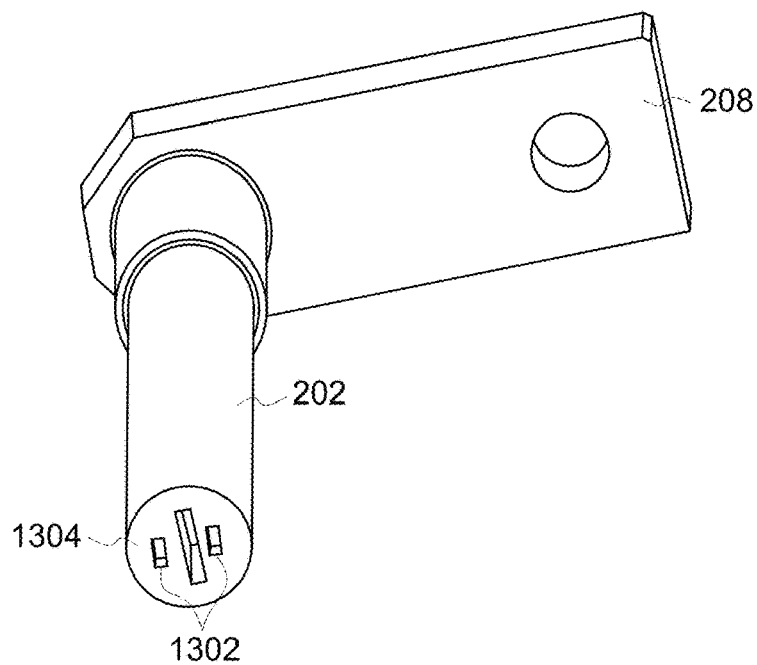
FIG. 13B is a bottom perspective view of the heat exchanger and the upper connector in the lead assembly shown in FIG. 13A.

FIGS. 13A-13B show an exemplary mechanism of protecting the HTS conductor 120 by including a temperature sensor 1302. FIG. 13A shows the lead assembly 112 included with the temperature sensor 1302. FIG. 13B shows a bottom perspective view of the upper portion of the lead assembly 112 that includes the heat exchanger 202 and the upper connector 208. The temperature sensor 1302 may be installed at the bottom 1304 of the heat exchanger 202, where the heat exchanger 202 contacts the HTS assembly 118. The temperature sensor 1302 may be installed on the HTS assembly 118 to prevent the lead assembly 112 from overheating. A plurality of temperature sensors 1302 may be installed at other locations on the lead assembly 112, such as on the upper connector 208 or the other location on the heat exchanger. The temperature sensor 1302 is used to monitor the temperatures of the HTS assembly 118 and/or the lead assembly 112. If the HTS assembly 118 reaches a predetermined threshold, such as 50 K, protective actions may be initiated. Protective actions may include one or more of sounding an alarm to the operator to take actions to protect the HTS assembly 118, increasing vapor cooling from the cryogen to bring the temperature down, or turning off the current.

Figure 14:
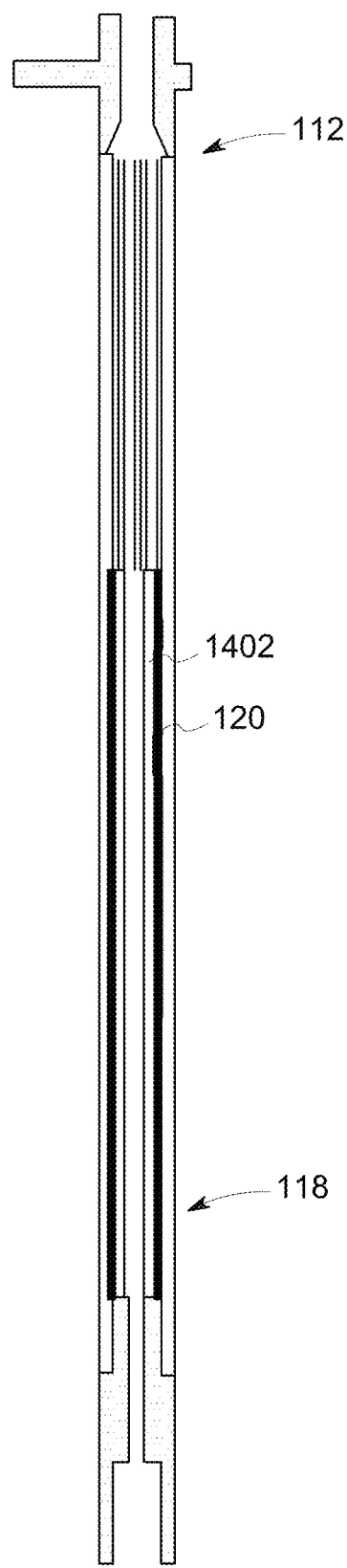
FIG. 14 is another exemplary lead assembly implement with another mechanism of protecting the HTS conductor of the lead assembly.

FIG. 14 shows another exemplary mechanism of protecting the HTS conductor 120. The HTS assembly 118 may include a layer 1402 of thermal conductive metal. The layer 1402 may be soldered to the HTS conductor 120. The layer 1402 has a relatively low thermal conductivity. An exemplary material for the layer 1402 is brass. When the HTS conductor 120 is not operated under a superconducting condition, heat generated by the HTS conductor 120 may be transmitted to the layer 1402 and out to the heat exchanger 202 and the vessel 102 such that the HTS conductor 120 is not overheated. Because the layer 1402 conducts heat into the vessel 102, heat leaks into the vessel 102 at all times and as a result the cost associated with cryogen loss is increased.

Figure 15:
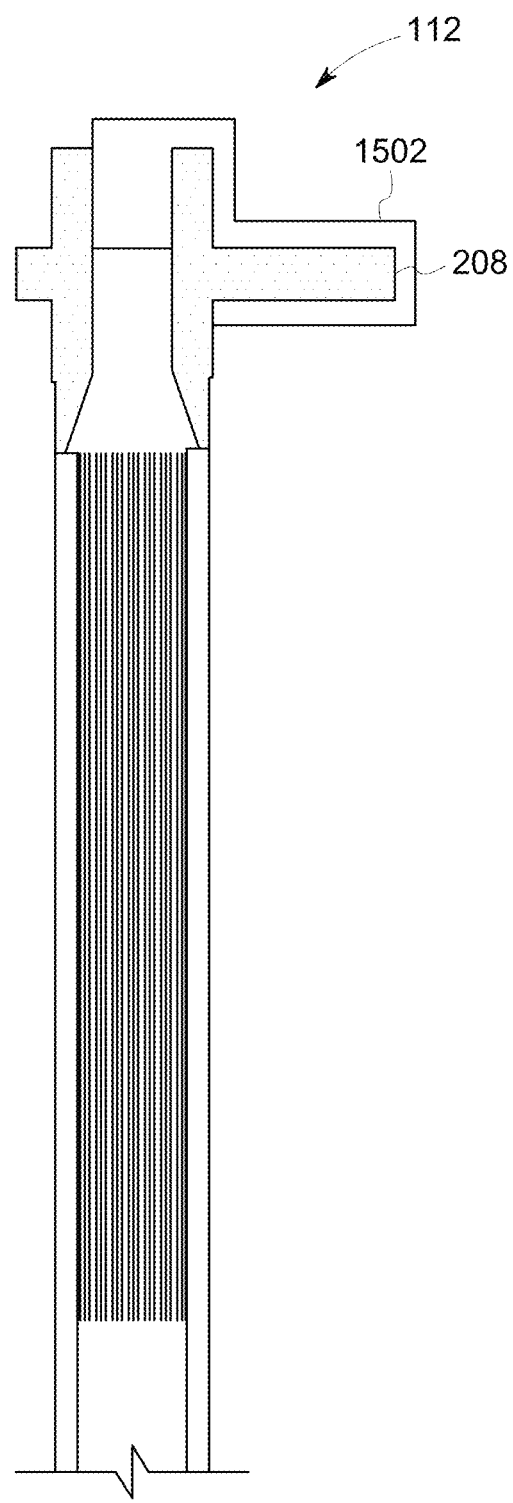
FIG. 15 is an exemplary poka-yoke design of a lead assembly.

Because the conducting condition of the HTS conductor 120 is sensitive to the temperature, the lead assembly 112 may include a poka-yoke design (FIG. 15). In this design, the lead assembly 112 may include a cover 1502 that covers the upper connector 208. The cover 1502 is composed of an electrically nonconductive material, such as rubber or silicone. The cover 1502 has to be removed before electric connection can be made. Accordingly, electricity does not accidentally run through the HTS assembly 118 when the temperature of the HTS assembly 118 is not at or below the superconducting critical temperature.

Figure 16A:
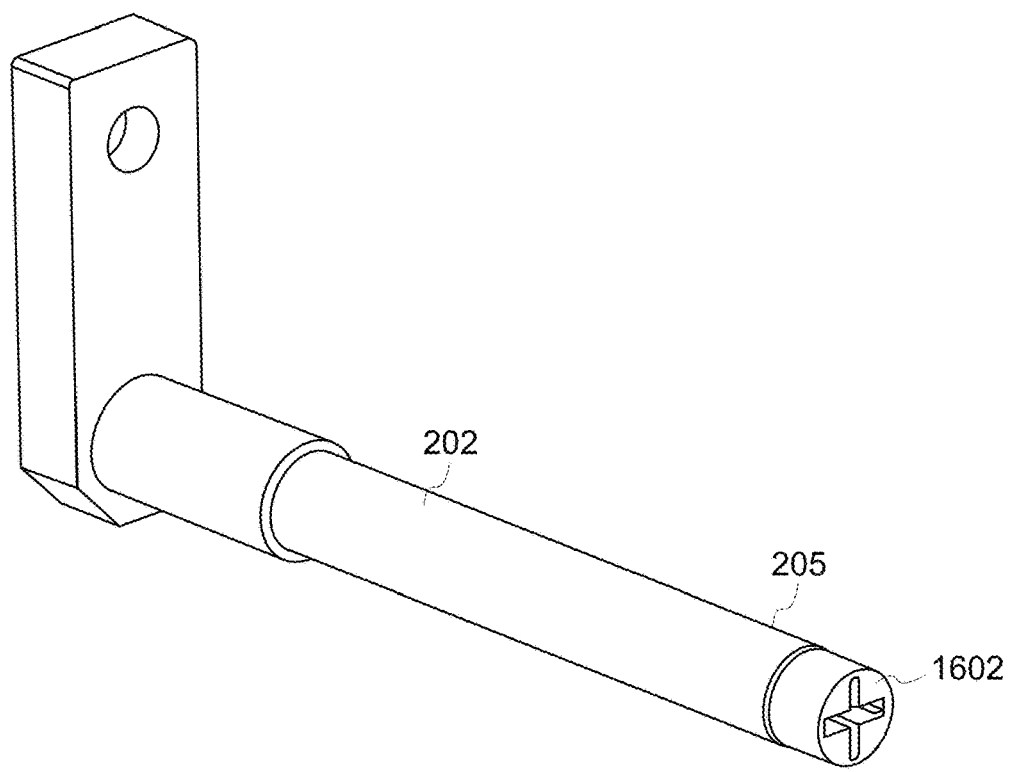
FIG. 16A shows an exemplary heat exchanger coupled to an upper connector and an interconnector.
Figure 16B:
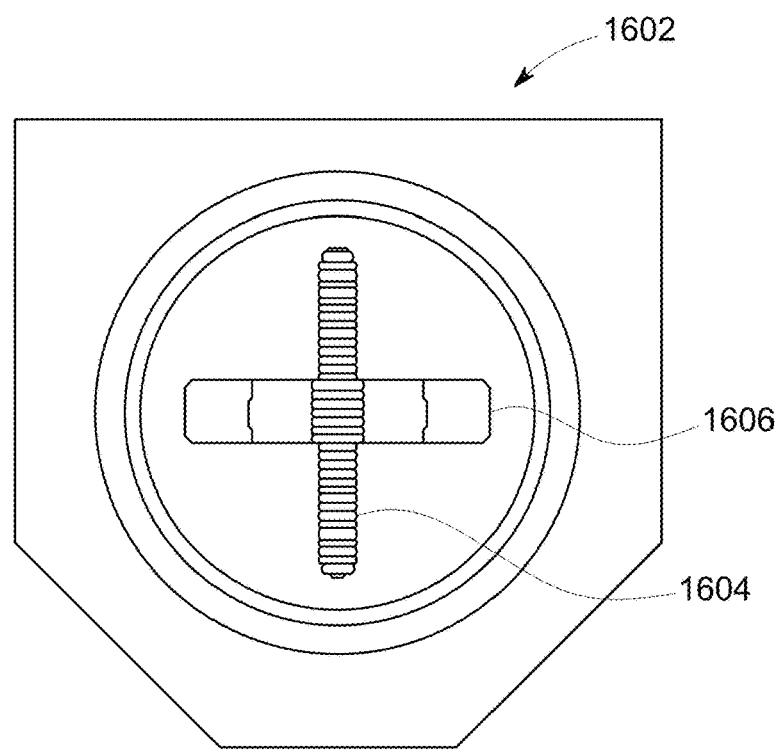
FIG. 16B shows a bottom view of the interconnector shown in FIG. 16A.
Figure 16C:
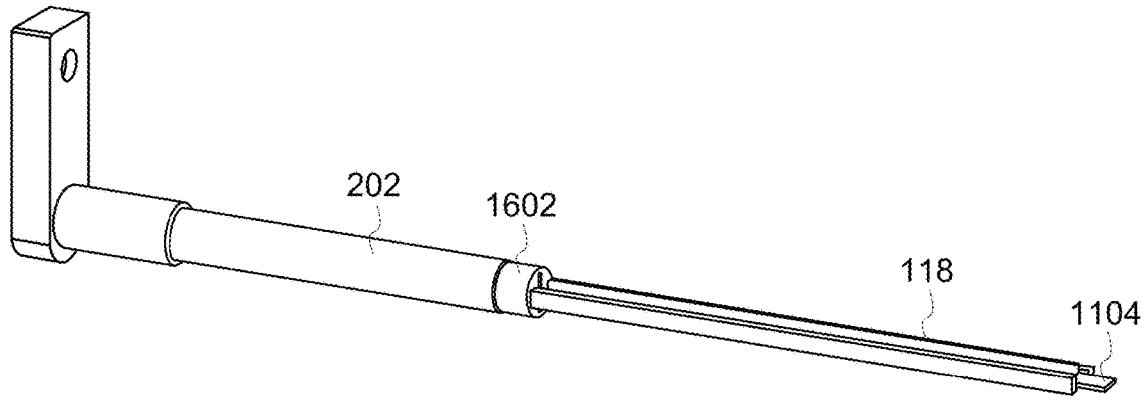
FIG. 16C shows the heat exchanger shown in FIG. 16A coupled to a lead assembly.
Figure 16D:
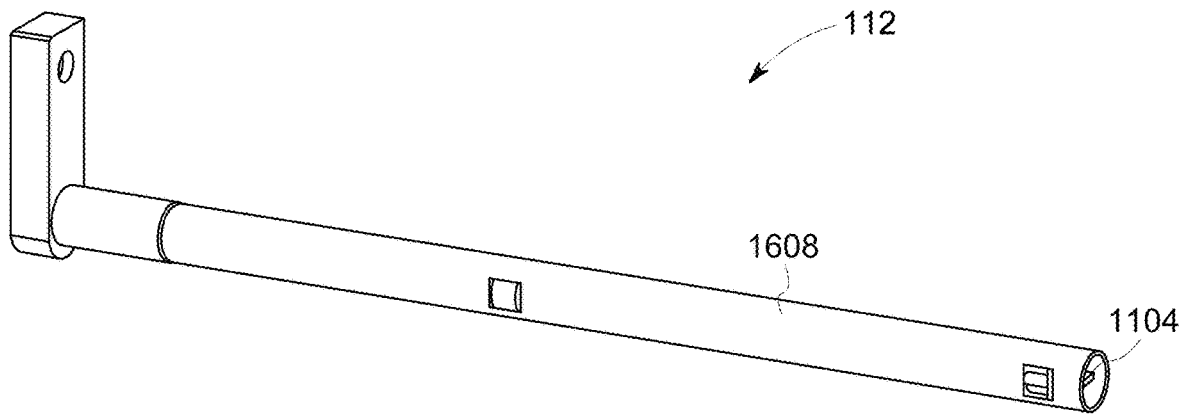
FIG. 16D shows a sleeve enclosing the heat exchanger and the lead assembly shown in FIG. 16C.
Figure 16E:
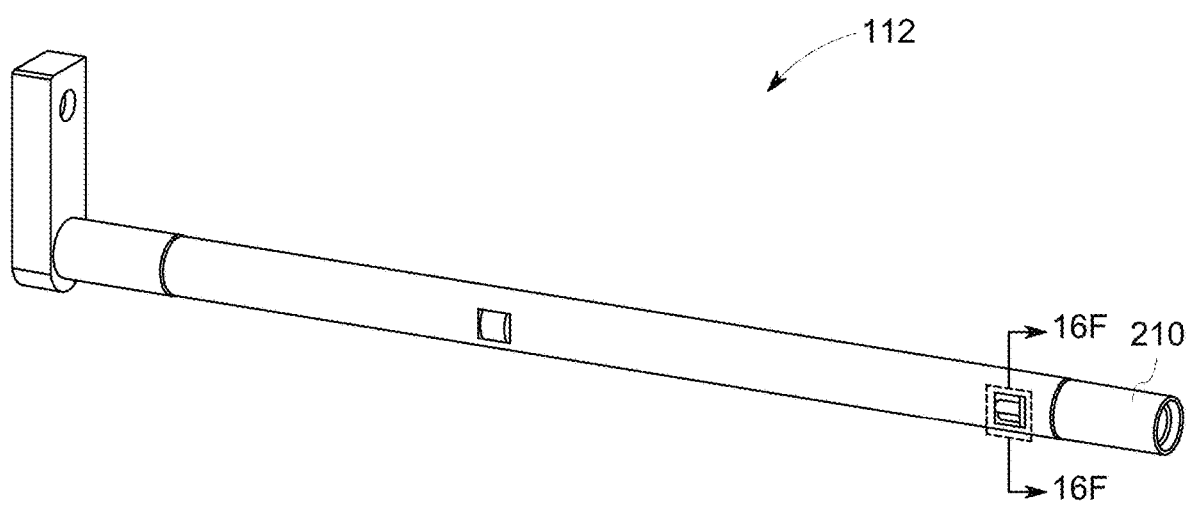
FIG. 16E shows that a lower connector is coupled to the lead assembly shown in FIGS. 16C and 16D.
Figure 16F:
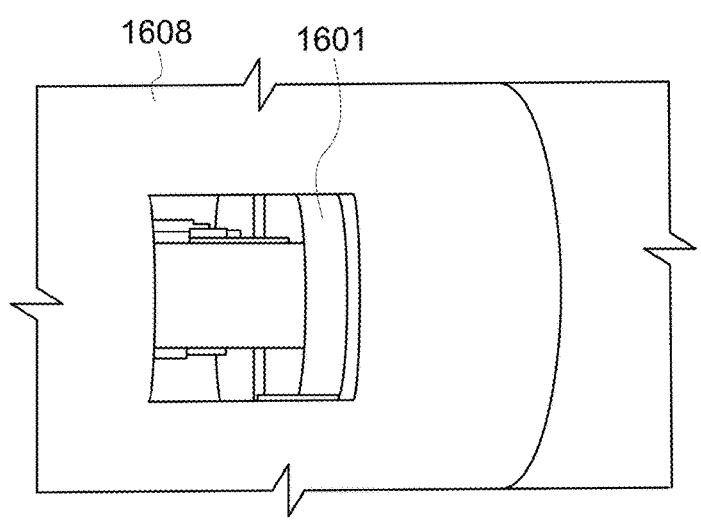
FIG. 16F shows an enlarged view of a portion of the lead assembly shown in FIG. 16E.

FIGS. 16A-16F show the stages of the process of assembling the lead assembly 112. FIGS. 16A and 16B show an interconnector 1602 may be coupled to the heat exchanger 202 at the second end 205. FIG. 16 B shows the bottom perspective view of the interconnector 1602. The interconnector 1602 may be composed of brazed copper. The interconnector 1602 may include a first slot 1604 and a second slot 1606. The first slot 1604 allows heat to go through and may be used for cooling. The second slot 1606 may be used for inserting and soldering a terminal 1104 (see FIGS. 11A and 11B) of the HTS assembly 118 and establishing an electrical contact between the HTS assembly 118 and the heat exchanger 202. FIG. 16C shows the HTS assembly 118 is coupled to the heat exchanger 202 at the interconnector 1602. A sleeve 1608 may be used to cover the heat exchanger 202 and the HTS assembly 118 (FIG. 16D). The sleeve 1608 provides structural support for the lead assembly 112 and insulates the lead assembly 112 electrically from the surroundings of the lead assembly 112. The sleeve 1608 may be composed of G-10. FIG. 16E shows that the lower connector 210 is then coupled to the other terminal 1104 (see FIGS. 11A and 11B) of the HTS assembly 118 and coupled to the sleeve 1608. The sleeve 1608 may include one or more windows 1601 such that temperature sensors 1302 may be installed. After temperature sensors 1302 are installed, the windows 1601 are patched and sealed. The coupling of electrically-conductive components such as the interconnector 1602, the HTS assembly 118, the lower connector 210, and/or the upper connector may be accomplished by soldering.

At least one technical effect of the systems and methods described herein includes (a) an embedded lead assembly for a cryogenic apparatus causing reduced boil-off of cryogen during ramping; (b) an embedded lead assembly having zero or near zero boil-off of cryogen when no current flows through the lead assembly; (c) a high-efficiency heat exchanger for an embedded lead assembly; (d) a process of designing and manufacturing a heat exchanger and a lead assembly using additive manufacturing; and (e) a cryogenic system that includes an embedded lead assembly having a heat exchanger coupled to an HTS assembly for supplying power to the cryogenic apparatus of the cryogenic system.

Exemplary embodiments of systems and methods of reducing noise and artifacts are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of manufacturing a lead assembly of a cryogenic system, comprising:
    developing a first three-dimensional (3D) model of a heat exchanger having a first end and a second end opposite the first end, the heat exchanger including a plurality of channels extending longitudinally through the heat exchanger from the first end to the second end, the plurality of channels forming a plurality of thermal surfaces within the heat exchanger, the heat exchanger having a transverse cross section;
    determining a thermal performance of the heat exchanger according to the first 3D model;
    modifying the first 3D model based on the determined thermal performance to generate a second 3D model of the heat exchanger, the second 3D model having both a reduced solid area of the cross section and increased thermal surfaces of the plurality of thermal surfaces relative to the first 3D model such that a temperature at the second end of the heat exchanger according to the second 3D model is at or below a critical superconducting temperature of a high temperature superconductor (HTS) strip during ramping of the cryogenic system;

additively manufacturing the heat exchanger using an electrically-conductive and thermally-conductive material according to the second 3D model;

providing a HTS assembly that includes the HTS strip; and connecting the HTS assembly to the heat exchanger at the second end of the heat exchanger.

2. The method of claim 1, wherein modifying the 3D model further comprises:

minimizing the solid area of the cross section of the heat exchanger; and maximizing the plurality of thermal surfaces of the heat exchanger.

3. The method of claim 1, wherein the heat exchanger includes a plurality of fins extending axially and forming the plurality of channels.

4. The method of claim 1, wherein the plurality of channels are spiral.

5. The method of claim 1, wherein the heat exchanger includes a plurality of baffles zigzagging inside the heat exchanger and forming the plurality of channels.

6. The method of claim 1, wherein providing an HTS assembly further comprises enclosing the HTS strip with an enclosure, the enclosure composed of an electrically-nonconductive and thermally-nonconductive material.

7. The method of claim 6, wherein the material is G-10.

8. The method of claim 1, further comprising:

testing a temperature of the heat exchanger at the second end while keeping a temperature of the heat exchanger at the first end at approximately 273 Kelvin (K); and if the temperature of the heat exchanger at the second end is greater than 50 K, repeating modifying the 3D model.

9. The method of claim 8, wherein testing a temperature further comprises testing the temperature of the heat exchanger based on a computer simulation of thermal exchange of the heat exchanger.

10. A method of manufacturing a lead assembly of a cryogenic system, comprising:

developing a first three-dimensional (3D) model of a heat exchanger having a first end and a second end opposite the first end, the heat exchanger including a plurality of fins extending longitudinally through the heat exchanger from the first end to the second end, the plurality of fins including a plurality of thermal surfaces and forming a plurality of channels within the heat exchanger, the heat exchanger having a transverse cross section;

determining a thermal performance of the heat exchanger according to the first 3D model;

modifying the first 3D model based on the determined thermal performance to generate a second 3D model of the heat exchanger, the second 3D model having both a reduced solid area of the cross section and increased thermal surfaces of the plurality of thermal surfaces relative to the first 3D model such that a temperature at the second end of the heat exchanger according to the second 3D model is at or below a critical superconducting temperature of a high temperature superconductor (HTS) strip during ramping of the cryogenic system;

additively manufacturing the heat exchanger using an electrically-conductive and thermally-conductive material according to the second 3D model;

providing a HTS assembly that includes the HTS strip; and connecting the HTS assembly to the heat exchanger at the second end of the heat exchanger.

\* \* \* \* \*